United States Patent
Fukami et al.

(10) Patent No.: US 10,622,550 B2
(45) Date of Patent: *Apr. 14, 2020

(54) MAGNETORESISTANCE EFFECT ELEMENT INCLUDING A RECORDING LAYER WITH PERPENDICULAR ANISOTROPY AND A BIAS LAYER COMPRISED OF AN ANTIFERROMAGNETIC MATERIAL, MAGNETIC MEMORY DEVICE, MANUFACTURING METHOD, OPERATION METHOD, AND INTEGRATED CIRCUIT

(71) Applicant: TOHOKU UNIVERSITY, Sendai-shi, Miyagi (JP)

(72) Inventors: Shunsuke Fukami, Sendai (JP); Hideo Ohno, Sendai (JP); Tetsuo Endoh, Sendai (JP)

(73) Assignee: TOHOKU UNIVERSITY, Sendai-Shi, Miyagi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/718,990

(22) Filed: Sep. 28, 2017

(65) Prior Publication Data

US 2018/0019388 A1    Jan. 18, 2018

Related U.S. Application Data

(63) Continuation of application No. PCT/JP2016/060264, filed on Mar. 29, 2016.

(30) Foreign Application Priority Data

Mar. 31, 2015  (JP) .................................. 2015-073178

(51) Int. Cl.
*G11C 7/00*     (2006.01)
*H01L 43/08*    (2006.01)
(Continued)

(52) U.S. Cl.
CPC ............. *H01L 43/08* (2013.01); *G06N 3/049* (2013.01); *G06N 3/0635* (2013.01); *G06N 3/088* (2013.01);
(Continued)

(58) Field of Classification Search
CPC ...................................................... G11C 11/15
(Continued)

(56) References Cited

U.S. PATENT DOCUMENTS 9,230,626 B2 *  1/2016 Buhrman ................ G11C 11/18
9,941,468 B2 *  4/2018 Fukami ................... H01L 43/08
(Continued)

FOREIGN PATENT DOCUMENTS

JP    2013-109822 A    6/2013
JP    2013-541219 A    11/2013
(Continued)

*Primary Examiner* — Hoai V Ho
(74) *Attorney, Agent, or Firm* — Rabin & Berdo, P.C.

(57) ABSTRACT

A magnetoresistance effect element includes a bias layer comprised of an antiferromagnetic material and having a shape in which a first length in a first direction greater than a second length in a second direction perpendicular to the first direction, a recording layer comprised of a ferromagnetic material and being disposed on the bias layer, a direction of magnetization of the recording layer being reversible, a barrier layer comprised of an insulation material and being disposed on the recording layer, and a reference layer comprised of a ferromagnetic material and being disposed on the barrier layer, a direction of magnetization of the reference layer being substantially fixed.

23 Claims, 33 Drawing Sheets

(51) Int. Cl.
*H01L 43/10* (2006.01)
*H01L 27/105* (2006.01)
*G11C 11/15* (2006.01)
*H01L 29/82* (2006.01)
*H03K 19/18* (2006.01)
*G06N 3/04* (2006.01)
*G06N 3/063* (2006.01)
*G06N 3/08* (2006.01)
*G11C 11/16* (2006.01)
*G11C 11/56* (2006.01)
*H01L 27/22* (2006.01)
*H01L 43/12* (2006.01)

(52) U.S. Cl.
CPC ............ *G11C 11/15* (2013.01); *G11C 11/161* (2013.01); *G11C 11/1673* (2013.01); *G11C 11/1675* (2013.01); *G11C 11/5607* (2013.01); *H01L 27/105* (2013.01); *H01L 27/226* (2013.01); *H01L 29/82* (2013.01); *H01L 43/10* (2013.01); *H01L 43/12* (2013.01); *H03K 19/18* (2013.01)

(58) Field of Classification Search
USPC .................................................. 365/46, 158
See application file for complete search history.

(56) References Cited

U.S. PATENT DOCUMENTS

| | | | |
|---|---|---|---|
| 10,102,956 B2* | 10/2018 | Cros | ..................... H01F 10/324 |
| 2005/0219769 A1* | 10/2005 | Shimura | ................ B82Y 10/00 |
| | | | 360/324.2 |
| 2010/0073998 A1* | 3/2010 | Nakayama | ............ H01L 27/228 |
| | | | 365/158 |
| 2011/0139606 A1 | 6/2011 | Tsunekawa et al. | |
| 2012/0018822 A1 | 1/2012 | Gaudin et al. | |
| 2012/0062220 A1* | 3/2012 | Hoppensteadt | ........ B82Y 25/00 |
| | | | 324/244 |
| 2012/0098077 A1 | 4/2012 | Gaudin et al. | |
| 2013/0128381 A1 | 5/2013 | Okamura et al. | |
| 2014/0056060 A1 | 2/2014 | Khvalkovskiy et al. | |
| 2014/0169088 A1 | 6/2014 | Buhrman et al. | |
| 2015/0213867 A1* | 7/2015 | Wu | ..................... G11C 11/1675 |
| | | | 365/158 |
| 2017/0222135 A1* | 8/2017 | Fukami | ................... H01L 43/08 |

FOREIGN PATENT DOCUMENTS

| | | |
|---|---|---|
| JP | 2014-30030 A | 2/2014 |
| JP | 2014-45196 A | 3/2014 |
| WO | WO-2013/025994 A2 | 2/2013 |

* cited by examiner

"0" MEMORY STATE
LOW RESISTANCE STATE

"1" MEMORY STATE
HIGH RESISTANCE STATE

"1" MEMORY STATE
LOW RESISTANCE STATE

"0" MEMORY STATE
HIGH RESISTANCE STATE

L: LONGITUDINAL EFFECTIVE MAGNETIC FIELD
T: TRANSVERSE EFFECTIVE MAGNETIC FIELD

MAGNETORESISTANCE EFFECT ELEMENT INCLUDING A RECORDING LAYER WITH PERPENDICULAR ANISOTROPY AND A BIAS LAYER COMPRISED OF AN ANTIFERROMAGNETIC MATERIAL, MAGNETIC MEMORY DEVICE, MANUFACTURING METHOD, OPERATION METHOD, AND INTEGRATED CIRCUIT

CROSS-REFERENCE TO RELATED APPLICATIONS

This application is a continuation application under 35 U.S.C. 120 of International Application PCT/JP2016/060264 having the International Filing Date of Mar. 29, 2016, and claims the priority of Japanese Patent Application No. JP PA 2015-073178, filed on Mar. 31, 2015. The identified applications are fully incorporated herein by reference.

BACKGROUND OF THE INVENTION

Technical Field

The present invention relates to a magnetoresistance effect element, a magnetic memory device, a manufacturing method, an operation method, and an integrated circuit.

Background Art

Attention has been paid to spin-transfer torque magnetic random access memory (STT-MRAM) using a magnetic tunnel junction element (MTJ element).

The specification of US Patent Application Publication No. 2012/0018822 discloses a laminate suited to a three-terminal STT-MRAM. This laminate has a structure in which the following are laminated: a first external layer made of a non-magnetic material, a center layer (recording layer) made of a magnetic material, and a second external layer made of a non-magnetic material. A reference layer made of a magnetic material is stacked onto the first external layer. During writing, a writing current parallel to the center layer is passed through the second external layer (conductive layer), and the STT causes the direction of magnetization of the center layer to reverse. The directions of magnetization of the center layer and the reference layer are both perpendicular to the in-plane direction of the second external layer.

Also, Japanese Unexamined Patent Application Publication (Translation of PCT Application) No. 2013-541219 discloses a laminate suited to a three-terminal STT-MRAM. This laminate has a structure in which the following are laminated: a first external layer made of a non-magnetic material, a center layer (recording layer) made of a magnetic material, and a second external layer made of a non-magnetic material. A reference layer is stacked onto the first external layer. During writing, a writing current parallel to the center layer is passed through the second external layer (conductive layer), and the STT causes the direction of magnetization of the center layer to reverse. The directions of magnetization of the center layer and the reference layer are both parallel to the in-plane direction of the second external layer and perpendicular to the flow direction of the writing current.

In both the specification of US Patent Application Publication No. 2012/0018822 and Japanese Unexamined Patent Application Publication (Translation of PCT Application) No. 2013-541219, at least one of the first external layer and the second external layer is made of a non-magnetic metal. Specific examples of non-magnetic metals that are disclosed include Pt, W, Ir, Ru, Pd, Cu, Au, Ag, Bi, and an alloy thereof.

SUMMARY OF THE INVENTION

In the laminate disclosed in the specification of US Patent Application Publication No. 2012/0018822, there is a need to apply a static magnetic field from outside. Thus, the STT-MRAM using the laminate disclosed in the specification of US Patent Application Publication No. 2012/0018822 needs to be provided with a device for applying a magnetic field to the laminate, and the configuration thereof is complex. Furthermore, this increases the manufacturing cost for the STT-MRAM.

In the laminate disclosed in Japanese Unexamined Patent Application Publication (Translation of PCT Application) No. 2013-541219, the center layer thereof has a magnetization direction perpendicular to the direction of the writing current (lengthwise direction of second external layer). Thus, the center layer needs to be long in the widthwise direction of the second external layer. This results in an increase in size of the memory cell. Furthermore, in the laminate of Japanese Unexamined Patent Application Publication (Translation of PCT Application) No. 2013-541219, the magnetization of the recording layer reverses due to precession. Thus, the threshold current increases in the nanosecond range, which renders high speed writing difficult.

WO 2013/025994 discloses a laminate in which the direction of the writing current and the direction of magnetization of the recording layer are perpendicular to each other. This laminate has a similar problem to the laminate disclosed in Japanese Unexamined Patent Application Publication (Translation of PCT Application) No. 2013-541219.

The present invention takes into consideration the situation described above, and an object thereof is to provide a small magnetoresistance effect element by which high speed writing is possible without the need to apply an external magnetic field, a magnetic memory device, a manufacturing method, an operation method, and an integrated circuit.

According to an aspect of the invention, there is provided a magnetoresistance effect element includes a bias layer comprised of an antiferromagnetic material and having a shape in which a first length in a first direction greater than a second length in a second direction perpendicular to the first direction, a recording layer comprised of a ferromagnetic material and being disposed on the bias layer, a direction of magnetization of the recording layer being reversible, a barrier layer comprised of an insulation material and being disposed on the recording layer, and a reference layer comprised of a ferromagnetic material and being disposed on the barrier layer, a direction of magnetization of the reference layer being substantially fixed.

According to another aspect of the invention, there is provided a magnetoresistance effect element including a bias layer made of a material containing at least one element selected from a first group consisting of Cr, Mn, Fe, Co, and Ni, and at least one element selected from a second group consisting of Ru, Rh, Pd, Ag, Os, Ir, Pt, and Au, a recording layer comprised of a ferromagnetic material and being disposed on the bias layer, a direction of magnetization of the recording layer being reversible, a barrier layer comprised of an insulator and being disposed on the recording layer, and a reference layer comprised of a ferromagnetic material and being disposed on the barrier layer, a direction of magnetization of the reference layer being substantially fixed.

According to an aspect of the invention, there is provided a method of manufacturing a magnetoresistance effect element including preparing a laminate structure including: a bias layer comprised of an antiferromagnetic material and having a shape having a shape in which a first length in a first direction greater than a second length in a second direction perpendicular to the first direction; a recording layer comprised of a ferromagnetic material and being disposed on the bias layer; a barrier layer comprised of an insulator and being disposed on the recording layer; and a reference layer comprised of a ferromagnetic material and being disposed on the barrier layer, heat treating the laminate structure in a magnetic field, and patterning one of the layers in the laminate structure by lithography.

According to the present invention, it is possible to provide a magnetoresistance effect element and a magnetic memory device that are small, and by which high speed writing is possible, without the need to apply an external magnetic field.

BRIEF DESCRIPTION OF THE DRAWINGS

FIG. 1A is a front view, FIG. 1B is a side view, and FIG. 1C is a top view.

FIG. 4A shows the magnetoresistance effect element prior to writing, FIG. 4B is waveform chart of a writing current, and FIG. 4C shows the magnetoresistance effect element after writing.

FIG. 5A shows the magnetoresistance effect element prior to writing, FIG. 5B is waveform chart of a writing current, and FIG. 5C shows the magnetoresistance effect element after writing.

FIG. 8A is for describing a spin current, and FIGS. 8B to 8D describe rotation of the magnetization direction by spin-orbit torque.

FIG. 11A is a front view, FIG. 11B is a side view, and FIG. 11C is a top view.

FIG. 12A is a front view and FIG. 12B is a side view. FIG. 12C is a front view and FIG. 12D is a side view.

FIG. 14A is a front view and FIG. 14B is a side view. FIG. 14C is a front view and FIG. 14D is a side view.

FIG. 15A is a front view and FIG. 15B is a side view.

FIG. 16A is a front view and FIG. 16B is a side view.

FIG. 21A shows a conventional arrangement example, and FIG. 21B shows an example of randomly arranging the plurality of layers.

DETAILED DESCRIPTION OF EMBODIMENTS

Below, a magnetoresistance effect element and a magnetic memory device using the magnetoresistance effect element according to embodiments of the present invention will be described with reference to drawings.

Embodiment 1

A magnetoresistance effect element according to Embodiment 1 will be described below with reference to FIGS. 1A to 8E.

Figure 1A:
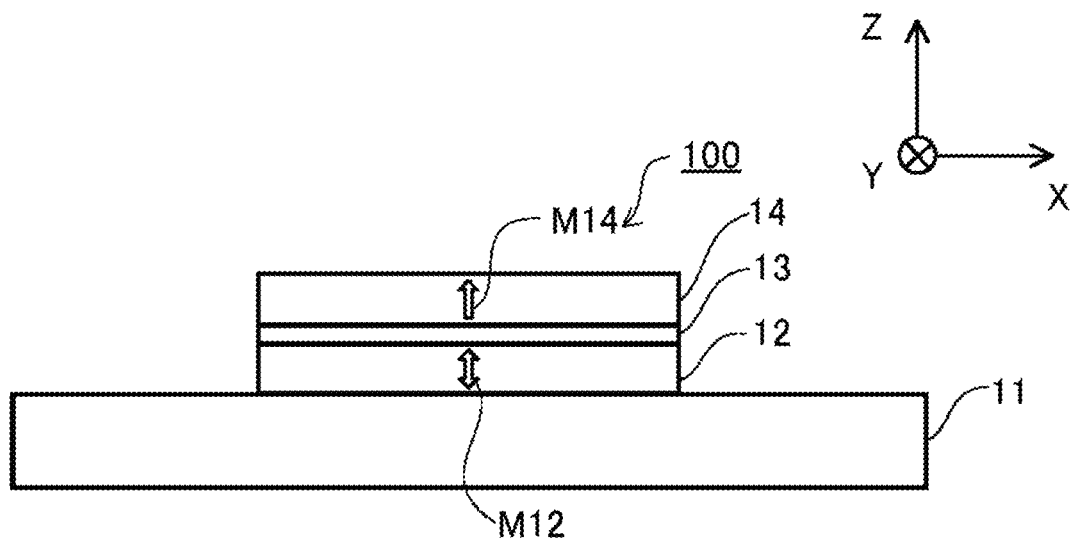
FIGS. 1A to 1C show a structure of a magnetoresistance effect element according to Embodiment 1 of the present invention.
Figure 1B:
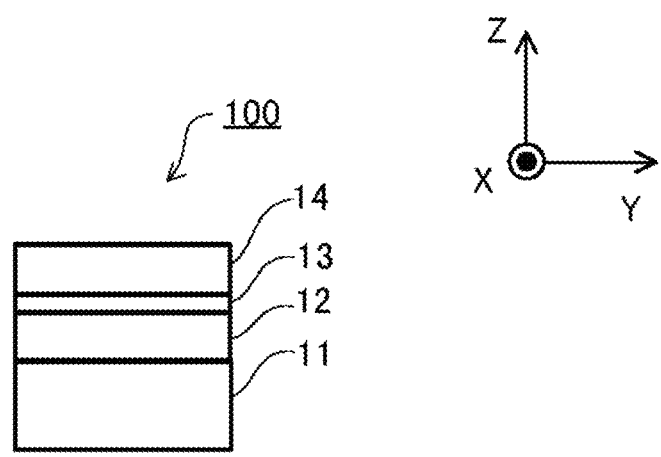
Figure 1C:
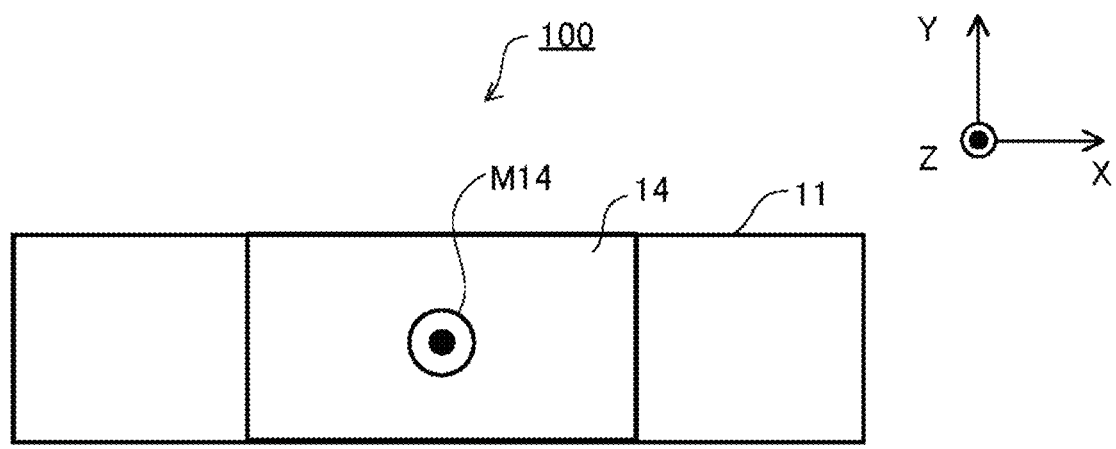

A magnetoresistance effect element 100 according to Embodiment 1, as shown in the front view of FIG. 1A, the side view of FIG. 1B, and the plan view (top view) of FIG. 1C, has a configuration in which a bias layer 11, a recording layer 12, a barrier layer 13, and a reference layer 14 are stacked. Here, the lengthwise (extension) direction of the bias layer 11 (rightward direction in FIG. 1A) is the X axis direction, the widthwise direction of the bias layer 11 (depth direction in FIG. 1A) is the Y axis direction, and the height direction of the magnetoresistance effect element 100 (upward direction in FIG. 1A) is the Z axis direction.

The bias layer 11 contains an antiferromagnetic material, and has a (long) flat shape that extends in a first direction (X axis direction). The bias layer 11 has a thickness of 1 nm to 15 nm and preferably 3 nm to 10 nm, an X axis direction length of 40 nm to 920 nm and preferably 60 nm to 600 nm, and a Y axis direction width of 15 nm to 150 nm and preferably 20 nm to 100 nm.

The bias layer 11 is conductive. The spin current generated when passing a writing current through the bias layer 11 causes the magnetization direction of the recording layer 12 to be rewritten (reversed). The writing current flows in the lengthwise direction (X axis direction) of the bias layer 11. The bias layer 11 is made of an alloy including at least one element selected from a first group and at least one element selected from a second group. The elements included in the first group are Cr, Mn, Fe, Co, and Ni. The elements included in the second group are Ru, Rh, Pd, Ag, Os, Ir, Pt, and Au. Examples of alloys constituting the bias layer 11 include a Pt—Mn alloy and an Ir—Mn alloy. When using a Pt—Mn alloy, it is preferable that the composition ratio for $Pt_xMn_{100-X}$ be set such that X is 30 to 70. It is preferable that an alloy of $Pt_{40}Mn_{60}$ be used, for example. Also, when using an Ir—Mn alloy, it is preferable that the composition ratio for $Ir_xMn_{100-X}$ be set such that X is 20 to 80.

The recording layer 12 is a ferromagnetic material adjacent to the bias layer 11. The recording layer 12 is formed on the bias layer 11. The recording layer 12 has a thickness of 0.8 nm to 5 nm and preferably 1 nm to 3 nm, an X axis direction length of 10 nm to 120 nm and preferably 20 nm to 100 nm, and a Y axis direction width of 10 nm to 120 nm and preferably 20 nm to 100 nm.

The recording layer 12 is formed on top of the bias layer 11, but "on top of" does not necessarily indicate the direction opposite to the direction of gravitational pull. The fact that the recording layer 12 is formed on top of the bias layer 11 indicates that the bias layer 11 is formed so as to be adjacent to the recording layer 12, for example. The layers need not necessarily be directly adjacent to each other as long as they are in the vicinity of each other. Another layer or an air space maybe be interposed between the recording layer 12 and the bias layer 11. This similarly applies to the description below, and for other layers.

The recording layer 12 has an axis of easy magnetization (axis of easy perpendicular magnetization) in the direction perpendicular to the film surface (z axis direction). However, the magnetization direction in a normal state may be inclined from the direction perpendicular to the film surface due to exchange bias from the bias layer 11. As a result of spin-orbit torque to be mentioned later, the Z component of magnetization shown by the arrow M12 changes between the +Z axis direction and the −Z axis direction.

The recording layer 12 includes a ferromagnetic material such as Fe, Co, or Ni. Specifically, the recording layer 12 may be made of a multilayer film of Co/Ni, Co/Pt, Co—Pd, Co/Au or Fe/Au; an alloy including Co—Pt, Co—Cr—Pt, Co—Pd, Fe—Pt, Fe—Pd, Fe—Co—Pt, or Fe—Co—Pd; or an alloy including CoFeB or FeB. Alternatively, the recording layer 12 may have a multilayer structure in which materials of differing categories are layered, such as [Co/Ni]/Ta/CoFeB.

The barrier layer 13 is made of an insulator adjacent to the recording layer 12. The barrier layer 13 is formed on the recording layer 12. The barrier layer 13 is made of an insulator such as MgO, $Al_2O_3$, or AlN. The barrier layer 13 is formed to a thickness of 0.1 nm to 5 nm, and preferably 0.5 nm to 2.5 nm, for example. The X axis direction and Y axis direction size of the barrier layer 13 is similar to that of the recording layer 12.

The reference layer 14 is made of a ferromagnetic material adjacent to the barrier layer 13. The reference layer 14 is formed on the barrier layer 13. In the reference layer 14, the magnetization direction M14 is substantially fixed to the Z axis direction. The X axis direction and Y axis direction size of the reference layer 14 is the same as that of the recording layer 12.

Figure 2:
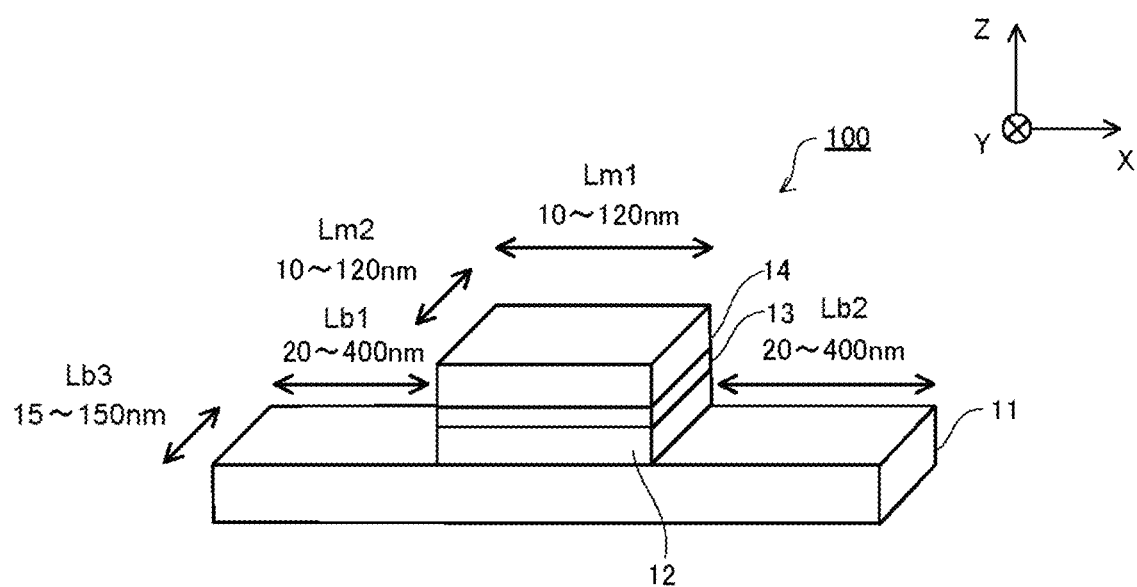
FIG. 2 shows an example of a shape of the magnetoresistance effect element.

FIG. 2 shows an example of a shape of the magnetoresistance effect element 100.

The X axis direction length Lm1 of the recording layer 12, the barrier layer 13, and the reference layer 14 is typically set to 10 to 120 nm. The Y direction length Lm2 of the recording layer 12, the barrier layer 13, and the reference layer 14 is typically set to 10 to 120 nm. The X axis direction lengths Lb1 and Lb2 of portions of the bias layer 11 not overlapped in the x-y plane by the recording layer 12, the barrier layer 13, and the reference layer 14 are typically set to 20 to 400 nm. The Y direction length Lb3 of the bias layer 11 is typically set to 15 to 150 nm. It is preferable that the size relationships of Lm1, Lm2, Lb1, Lb2, and Lb3 satisfy the following inequalities. Lm1~Lm2, Lm2≤Lb3, Lm1<~Lb1~Lb2. Here, the symbol "~" indicates that values on both sides are approximately the same, and indicates a range of ±50%, for example. The symbol "<~" indicates that the right side is approximately the same as or greater than the left side, and that the right side is −50% or more of the left side. Also, in the drawing, the bias layer 11 is depicted as being rectangular, and the recording layer 12, the barrier layer 13, and the reference layer 14 are depicted as being square, but the actual shape can be freely changed. The x-y plane shapes of the recording layer 12, the barrier layer 13, and the reference layer 14 can be appropriately designed to be a circle, an ellipse, a parallelogram, a hexagon, or the like such that suitable device operation can be realized.

The layers from the bias layer 11 to the reference layer 14 are each deposited onto a substrate (not shown) by ultra-high vacuum sputtering or the like, and then subjected to heat treatment in a magnetic field. Treatment conditions include the following, for example—temperature: 300° C., retention time: 2 hours, magnetic flux density: 1.2 T. The magnetic field is set to within ±45 degrees of the lengthwise direction of the bias layer 11, and preferably within ±30 degrees. By this treatment, it is possible to attain a uniform magnetization direction for the antiferromagnetic material included in the bias layer 11, and furthermore, it is possible for the antiferromagnetic material included in the bias layer 11 to apply an internal magnetic field to the ferromagnetic material included in the adjacent recording layer 12 as a result of exchange bias. Then, the deposited films are patterned into an appropriate shape by lithography or the like.

Alternatively, the layers from the bias layer 11 to the reference layer 14 may be deposited in a magnetic field with a prescribed magnetic flux density and then patterned without performing heat treatment.

One example of a configuration of each layer (film configuration) of the magnetoresistance effect element 100 is as follows:

base layer: Ta, thickness 3 nm,
seed layer: Pt, thickness 4 nm,
bias layer 11: PtMn, thickness 7 nm,
recording layer 12: Co, thickness 0.3 nm; Ni, thickness 0.6 nm; Co, thickness 0.3 nm; Ni, thickness 0.6 nm; Co, thickness 0.3 nm,
barrier layer 13: MgO, thickness 1.2 nm,
reference layer 14: CoFeB, thickness 1.5 nm; Ta, thickness 0.5 nm; Co, thickness 0.4 nm; Pt, thickness 0.4 nm; Co, thickness 0.4 nm; Pt, thickness 0.4 nm; Co, thickness 0.4; Ru, thickness 0.45 nm; Co, thickness 0.4 nm; Pt, thickness 0.4 nm; Co, thickness 0.4 nm; Pt, thickness 0.4 nm; Co, thickness 0.4 nm; Pt, thickness 0.4 nm; Co, thickness 0.4 nm; Pt, thickness 0.4 nm, and cap layer: Ru, thickness 5 nm.

In this example, the reference layer 14 has a laminated ferri-structure, and has Ru as a coupling layer in the laminated ferri-structure. Also, the base layer, the seed layer, and the cap layer are appropriately provided in order to improve adhesion to the substrate, crystal orientation, electrical conductivity, and resistance to corrosion.

Another example of a film configuration of the magnetoresistance effect element 100 is as follows:

base layer: Ta, thickness 3 nm,
bias layer 11: IrMn, thickness 3 nm,
recording layer 12: CoFe, thickness 1.2 nm,
barrier layer 13: MgO, thickness 1.2 nm,
reference layer 14: CoFeB, thickness 1.5 nm; Ta, thickness 0.5 nm; Co, thickness 0.4 nm; Pd, thickness 0.8 nm; Co, thickness 0.4 nm; Pd, thickness 0.8 nm; Co, thickness 0.4 nm; Pd, thickness 0.8 nm; Co, thickness 0.4 nm; Pd, thickness 0.8 nm; Co, thickness 0.4 nm; Pd, thickness 0.8 nm, and cap layer: Ru, thickness 5 nm.

Suitable ranges for film thickness and dimensions illustrated here are set according to the state of the art for current semiconductor integrated circuits, and the range of film thicknesses and dimensions for attaining the effects of the present invention can change as conventional processing techniques advance.

In the magnetoresistance effect element 100, the writing current passing through the bias layer 11 causes the Z component in the magnetization M12 of the recording layer 12 to reverse between the +Z axis direction and the −Z axis direction. In this manner, in the magnetoresistance effect element 100, the resistance between the bias layer 11 and the reference layer 14 changes from a relatively high resistance state to a relatively low resistance state. By the direction of magnetization M12 (that is, the resistance state) being allocated 1-bit data of "0" or "1", data can be recorded in the magnetoresistance effect element 100.

When reading the data from the magnetoresistance effect element 100, a voltage is applied between an electrode provided in the reference layer 14 and the bias layer 11, and a current Ir (read-out current) is passed. By determining the resistance (high or low) between the reference layer 14 and the bias layer 11 according to the applied voltage and the read-out current Ir, the direction of magnetization M12 of the recording layer 12 in relation to the direction of magnetization M14 of the reference layer 14 is determined. Data corresponding to the determined direction of magnetization M12 is determined.

Below, the read-out operation and the writing operation will be described in detail.

In the magnetoresistance effect element 100, the bias layer 11 functions as a bias magnetic field. Thus, it can be said that a static magnetic field (static magnetic field Ho) in the X axis direction is applied to the recording layer 12. The effect of the bias magnetic field by the bias layer 11 will be described later.

Figure 3A:
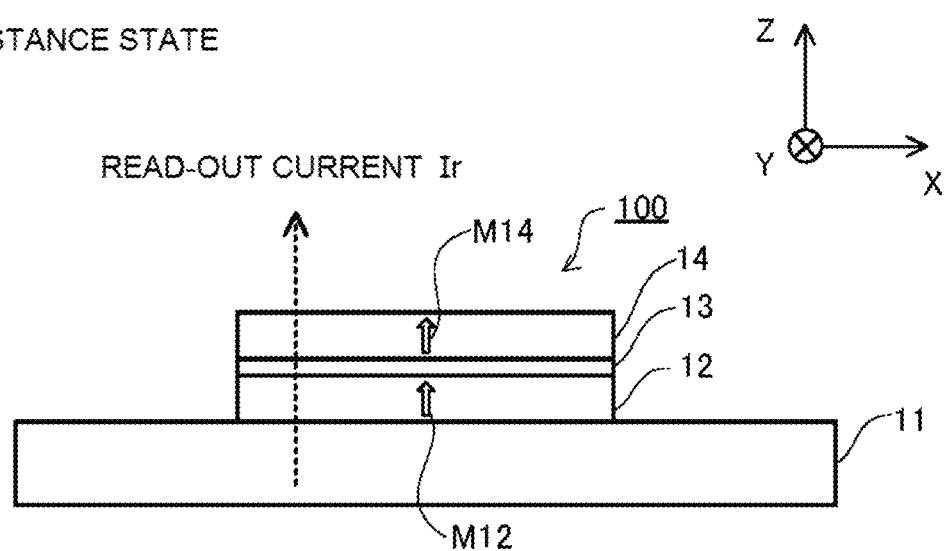
FIGS. 3A and 3B are for describing a read-out operation for reading data stored in the magnetoresistance effect element.
Figure 3B:
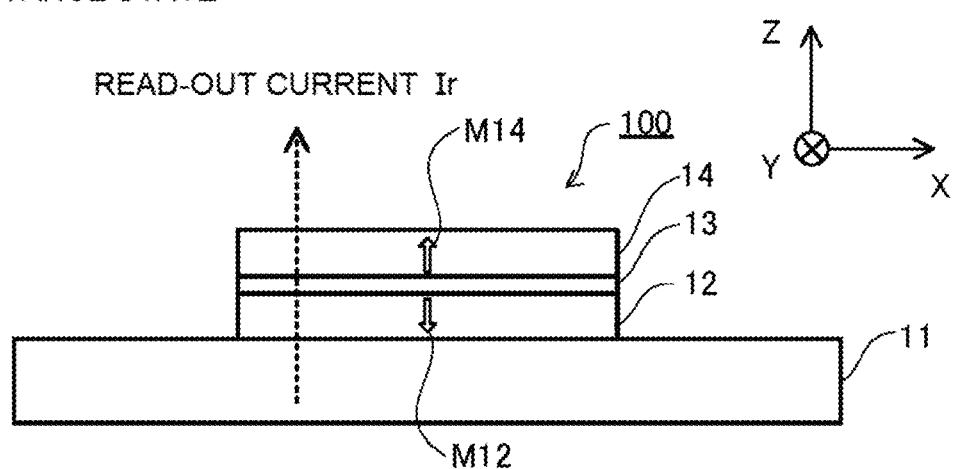

First, the read-out operation will be described with reference to FIGS. 3A and 3B. In the depiction of FIGS. 3A and 3B, the incline in direction of the magnetization M12 of the recording layer 12 resulting from the bias magnetic field from the bias layer 11 is omitted.

When reading the data from the magnetoresistance effect element 100, a predetermined voltage is applied between the electrode provided in the reference layer 14 and the bias layer 11. In the state of FIG. 3A, the direction of the magnetization M12 of the recording layer 12 is the +Z axis direction, and matches the direction of the magnetization M14 of the reference layer 14 (parallel state). Thus, the magnetoresistance effect element 100 is in a low resistance state in which the resistance of the current path from the bias layer 11 to the reference layer 14 is relatively low. Thus, the read-out current Ir is relatively large.

On the other hand, in the state of FIG. 3B, the direction of the magnetization M12 of the recording layer 12 is the −Z axis direction, and is opposite the direction of the magnetization M14 of the reference layer 14, which is the +Z axis direction (antiparallel state). Thus, the magnetoresistance effect element 100 is in a high resistance state in which the resistance of the current path from the bias layer 11 to the reference layer 14 is relatively high. Thus, the read-out current Ir is relatively small.

The resistance state of the current path from the bias layer 11 to the reference layer 14 is determined according to the size of the applied voltage and the read-out current. By associating the high resistance state and the low resistance state with "0" and "1", respectively, and switching the direction of the magnetization M12 of the recording layer 12, the magnetoresistance effect element 100 can operate as a memory. In the present embodiment, the low resistance state shown in FIG. 3A is defined as "0" and the high resistance state shown in FIG. 3B is defined as "1".

The definition of the stored data may be reversed to that. Here, the read-out current Ir flowing in the +Z axis direction is shown, but the direction of the read-out current Ir may be reversed. In FIGS. 3A and 3B, the read-out current Ir flows from the bias layer 11 towards the reference layer 14, but any other path may be used as long as the current flows in a direction passing through a magnetic tunnel junction formed by the recording layer 12, the barrier layer 13, and the reference layer 14.

Figure 4A:
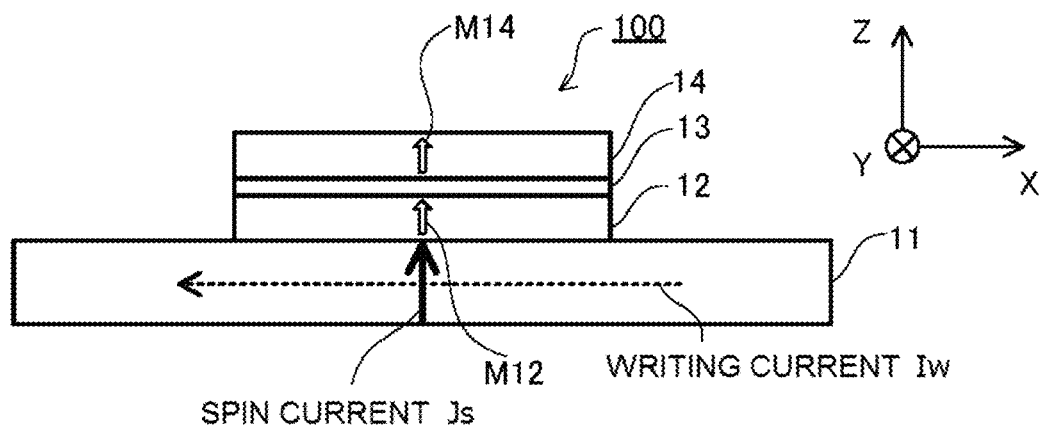
FIGS. 4A to 4C are for describing a writing operation for writing data "1" to the magnetoresistance effect element.
Figure 4B:
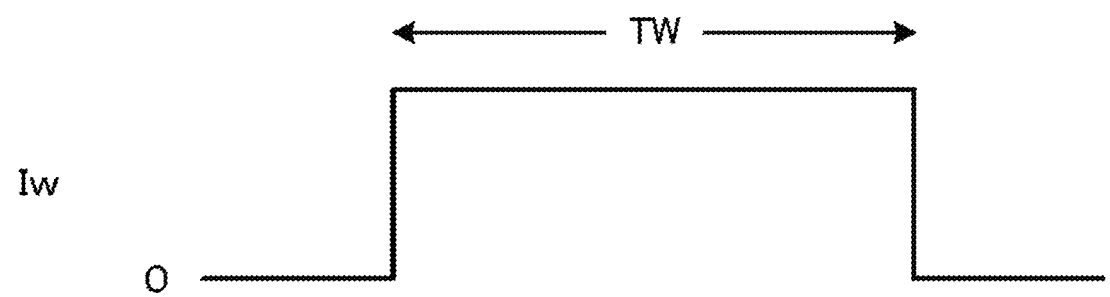
Figure 4C:
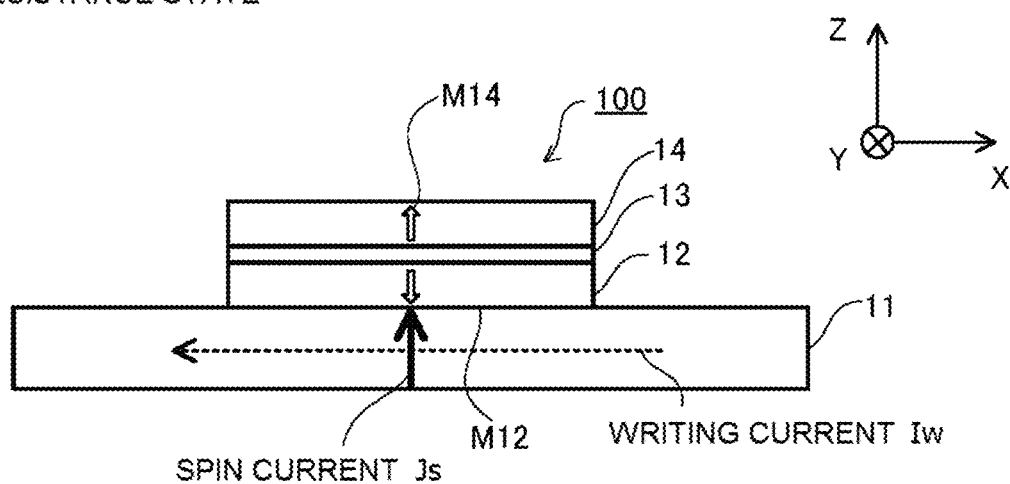

Next, the writing operation will be described with reference to FIGS. 4A to 5C. As described above, an X axis direction static magnetic field Ho is generated by the bias layer 11. When writing "1" in a magnetoresistance effect element 100 in which "0" is stored, a writing current Iw such as shown in FIG. 4B is pulsed in the lengthwise direction of the bias layer 11 as shown in FIG. 4A. As a result, a spin current Js (spin angular momentum flow) generated by the spin Hall effect or the like is in the +Z axis direction. Thus, the spin becomes eccentric and a spin-orbit torque acts on the recording layer 12, and as shown in FIG. 4C, the direction of the magnetization M12 of the recording layer 12 rotates and reverses, and the magnetizations M12 and M14 become antiparallel to each other, causing the magnetoresistance effect element 100 to be in a high resistance state. In other words, the stored data of "0" is overwritten by "1" in the magnetoresistance effect element 100. The direction of the magnetization M12 of the recording layer 12 is maintained even after the writing current Iw becomes 0. The pulse height of the writing current Iw is greater than or equal to a forward direction threshold IC1 to be described later with reference to FIG. 6, and a pulse width Tw is a time greater than or equal to the time required for rewriting, and in the present embodiment, this time is less than 200 nanoseconds, and is greater than or equal to 0.1 nanoseconds and less than 30 nanoseconds, for example.

Figure 5A:
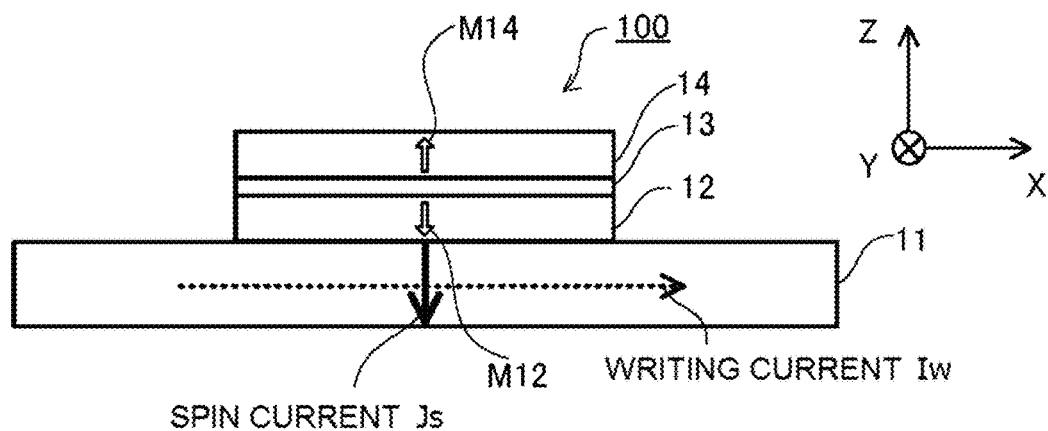
FIGS. 5A to 5C are for describing a writing operation for writing data "0" to the magnetoresistance effect element.
Figure 5B:
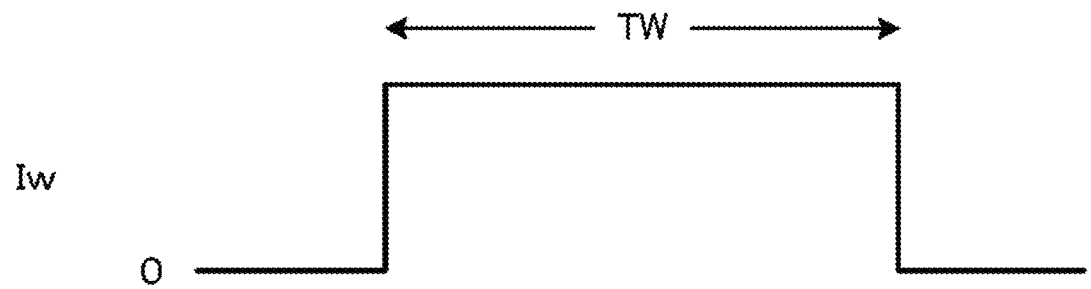
Figure 5C:
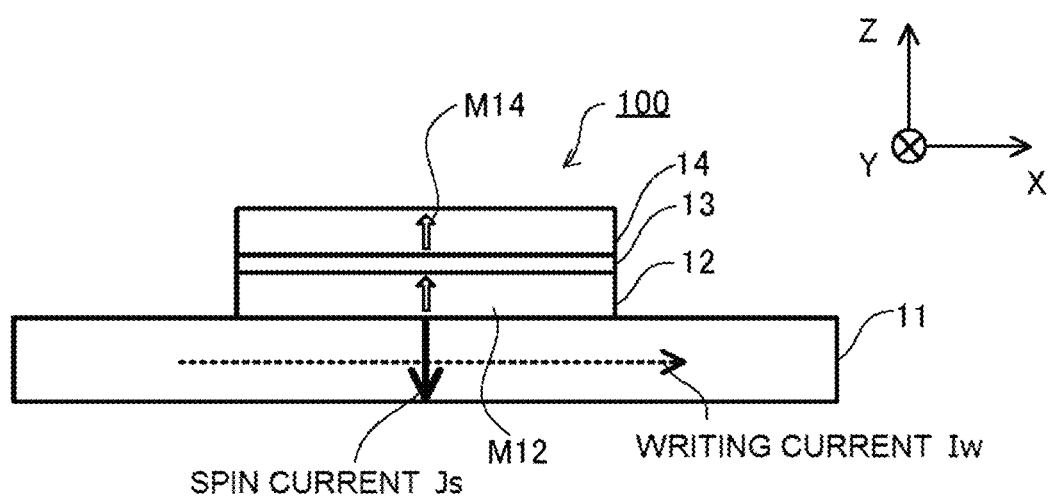

On the other hand, when writing "0" in a magnetoresistance effect element 100 in which "1" is stored, a writing current Iw such as shown in FIG. 5B is pulsed in the lengthwise direction of the bias layer 11 as shown in FIG. 5A. In this case, a spin current Js in the −Z axis direction is generated by the spin Hall effect or the like. Thus, the spin becomes eccentric and a spin-orbit torque acts on the recording layer 12, and as shown in FIG. 5C, the direction of the magnetization M12 of the recording layer 12 rotates and reverses. As a result, the magnetizations M12 and M14 become parallel and the magnetoresistance effect element 100 enters a low resistance state. In other words, the stored data is overwritten by "0" in the magnetoresistance effect element 100. The direction of the magnetization M12 of the recording layer 12 is maintained even after the writing current Iw becomes 0. The pulse height of the writing current Iw is greater than or equal to a reverse direction threshold IC0 to be described later with reference to FIG. 6, and a pulse width Tw is a time greater than or equal to the time required for rewriting of data, and in the present embodiment, this time is less than 200 nanoseconds, and is greater than or equal to 0.1 nanoseconds and less than 30 nanoseconds, for example.

In this manner, the data stored in the magnetoresistance effect element 100 can be rewritten.

When a writing current Iw for writing "0" flows into the bias layer 11 of the magnetoresistance effect element 100 currently storing "0", as well as when a writing current Iw for writing "1" flows into the bias layer 11 of the magnetoresistance effect element 100 currently storing "1", the spin-orbit torque and the static magnetic field Ho cancel each other out and data is not rewritten.

Figure 6:
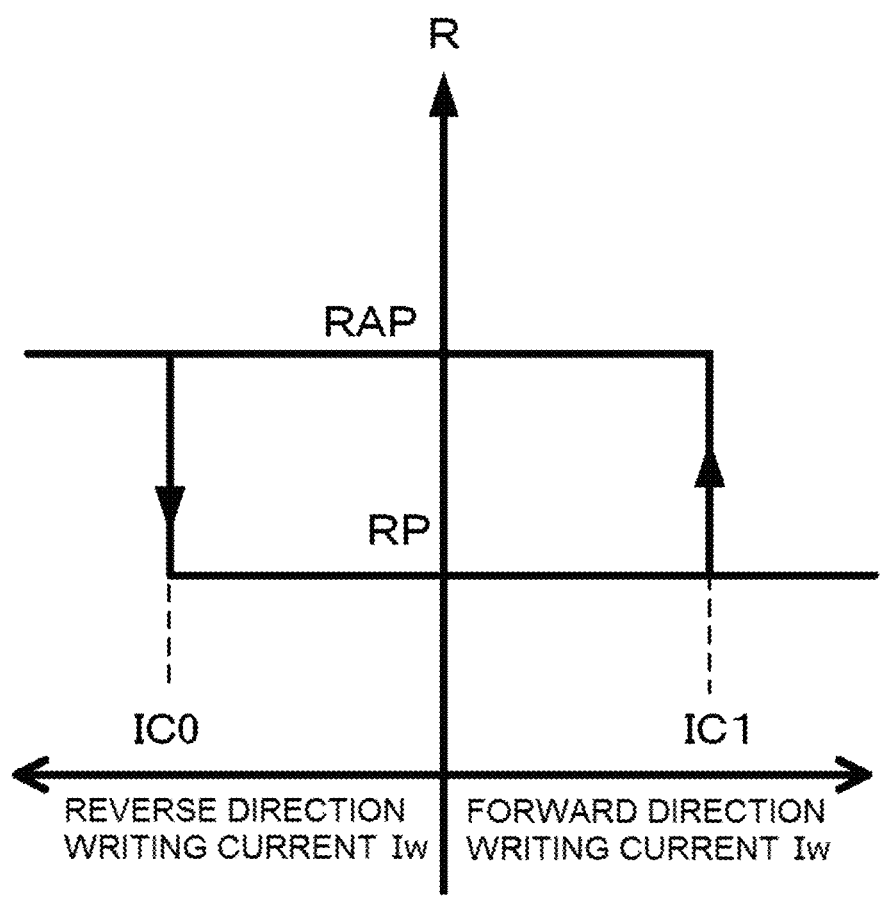
FIG. 6 shows a change in the writing current for the magnetoresistance effect element and the resistance R from the bias layer to the reference layer.

An example of the relationship between the writing current Iw and the resistance R between the bias layer 11 and the reference layer 14 is shown in FIG. 6. As shown, if a forward direction (−X axis direction) writing current Iw of greater than or equal to the threshold IC1 flows, the direction of the magnetization M12 of the recording layer 12 is caused to be opposite to the magnetization M14 of the reference layer 14 (antiparallel), and the resistance R becomes a relatively large value RAP. On the other hand, if a reverse direction (+X axis direction) writing current Iw of greater than or equal to the threshold IC0 flows, the direction of the magnetization M12 of the recording layer 12 is caused to be the same as the magnetization M14 of the reference layer 14 (parallel), and the resistance R becomes a relatively small value RP. The thresholds IC1 and IC0 of the writing current Iw at which rewriting of stored data occurs have substantially the same absolute value.

The relationship between the direction of the writing current Iw and the direction of the spin current changes depending on the materials used in the bias layer 11, the recording layer 12, and the barrier layer 13, as well as the combination of materials.

Figure 7:
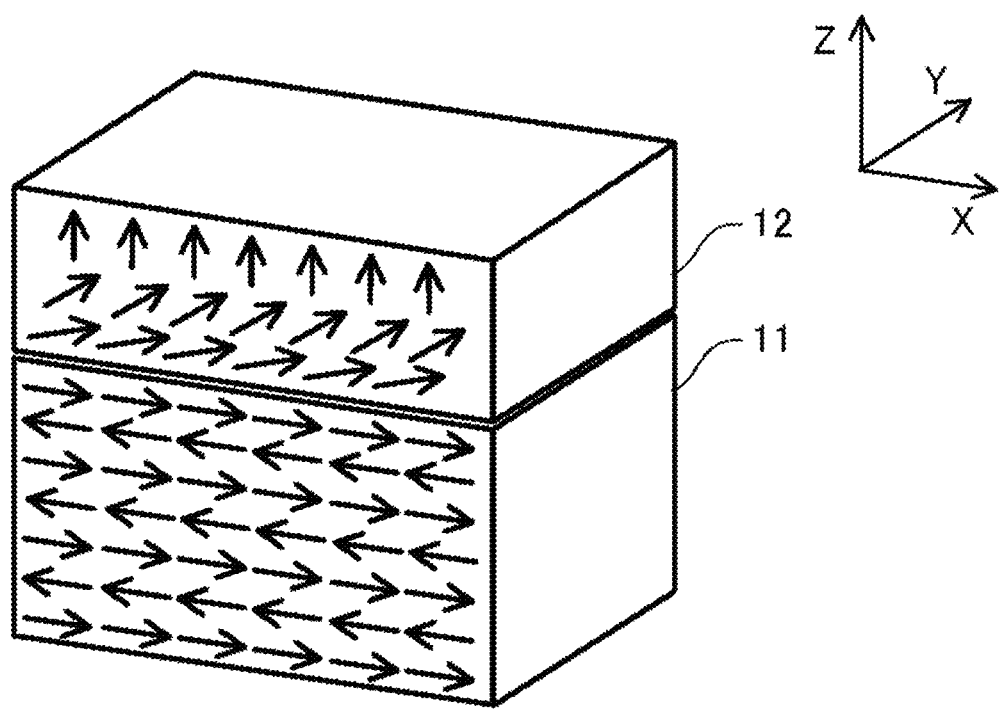
FIG. 7 is for describing the effect of exchange bias.

Next, the effect of the bias magnetic field by the bias layer 11 will be described with reference to FIG. 7.

Inside the antiferromagnetic material, a magnetic order exists in which adjacent magnetic moments differ in an alternating fashion. When the antiferromagnetic material is placed adjacent to the ferromagnetic material, the unidirectional bias magnetic field from the antiferromagnetic material acts on the ferromagnetic material. The effect of the magnetic field from the antiferromagnetic material on the ferromagnetic material is referred to as exchange bias. In the example shown, the magnetic moments inside the antiferromagnetic material alternate in direction in the in-plane direction. Thus, an in-plane exchange bias acts on the ferromagnetic material. If the ferromagnetic material has an axis of easy perpendicular magnetization, the magnetization of the ferromagnetic material rotates to the in-plane direction close to the interface with the antiferromagnetic material, and rotates towards the axis of easy magnetization of the ferromagnetic material itself in areas farther away from the antiferromagnetic material. In other words, by the antiferromagnetic material being adjacent to the ferromagnetic material, an in-plane direction magnetic field is applied to the ferromagnetic material.

In the magnetoresistance effect element 100, the bias layer 11 contains an antiferromagnetic material, and the recording layer 12 contains a ferromagnetic material. Thus, as shown in FIG. 7, by the bias layer 11 and the recording layer 12 being adjacent, an exchange bias acts on the recording layer 12. In the present embodiment, the bias magnetic field acts in the in-plane direction of the recording layer 12. Thus, in the present embodiment, there is no need for a configuration of applying an external magnetic field to the magnetoresistance effect element 100. In the description below, the bias magnetic field resulting from exchange bias from the bias layer 11 is referred to as the static magnetic field Ho.

Next, the mechanism for reversing the direction of the magnetization M12 of the recording layer 12 as a result of the spin-orbit torque as described above will be described with reference to FIGS. 8A and 8B. Here, the mechanism of reversing the direction of the magnetization M12 for when the spin-orbit torque applies due to the spin Hall effect will be described.

Figure 8A:
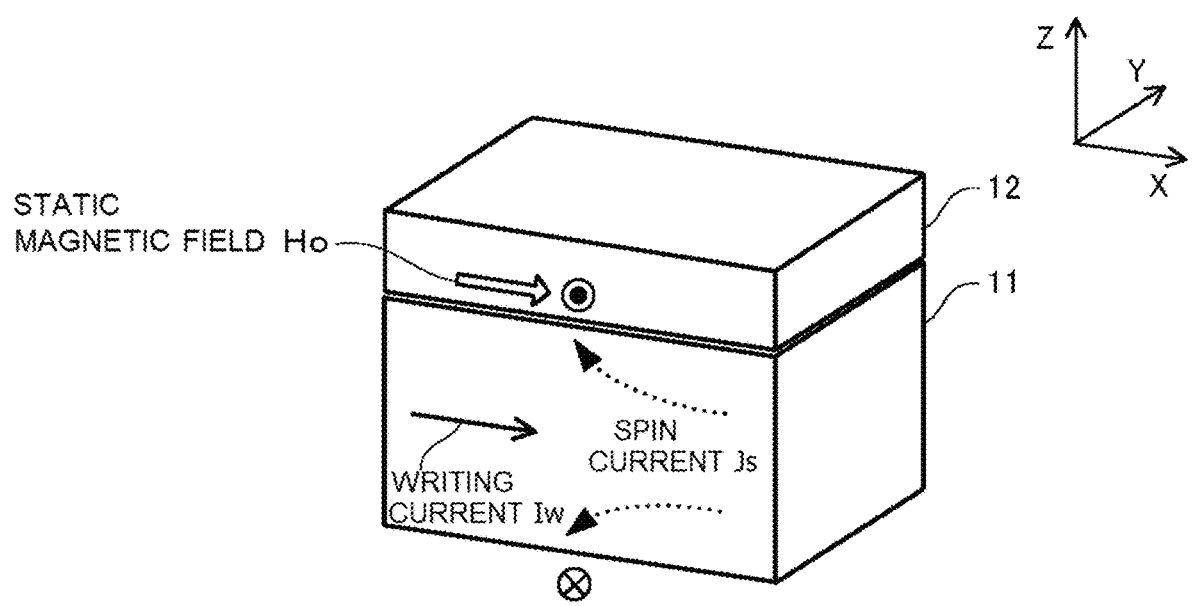
FIGS. 8A to 8E are for describing the mechanism of reversing the magnetization direction by spin-orbit torque.

FIG. 8A schematically shows the flow of the spin current Js when the writing current Iw flows in the +X axis direction in the bias layer 11. When the writing current Iw flows in the +X axis direction, electrons that have undergone spin polarization in the +Y axis direction are scattered in the −Z axis direction, and electrons that have undergone spin polarization in the −Y axis direction are scattered in the +Z axis direction. As a result, electrons that have undergone spin polarization in the −Y axis direction accumulate in the recording layer 12. The sign of the current (direction of the current) and the direction of scattering and size of the polarization spin are determined by the sign of the spin Hall angle and can be reverse to what was described above. The above description is based on the relationship between the current direction and the scattering direction for when the spin Hall angle is positive.

Electrons that have undergone spin polarization in the −Y axis direction apply torque in the direction of the magnetization M12 of the recording layer 12. This is the spin-orbit torque. There are two ways in which spin-orbit torque acts, and these can respectively be expressed as a longitudinal (effective) magnetic field (vertical magnetic field) and a transverse (effective) magnetic field (horizontal magnetic field). The longitudinal effective magnetic field corresponds to Slonczewski torque while the transverse effective magnetic field corresponds to field-like torque.

In FIGS. 8B to 8E schematically show the directions of the longitudinal effective magnetic field and the transverse effective magnetic field for when the magnetization M12 of the recording layer 12 faces four directions.

The transverse effective magnetic field always faces the +Y axis direction. On the other hand, the longitudinal effective magnetic field faces a direction that causes the magnetization M12 to rotate in the X-Z plane. The directions of the longitudinal effective magnetic field and the transverse effective magnetic field change depending on the combination of materials.

Here, as shown in FIG. 8A, it is assumed that a +X axis direction static magnetic field Ho from the bias layer 11 acts on the recording layer 12.

Figure 8B:
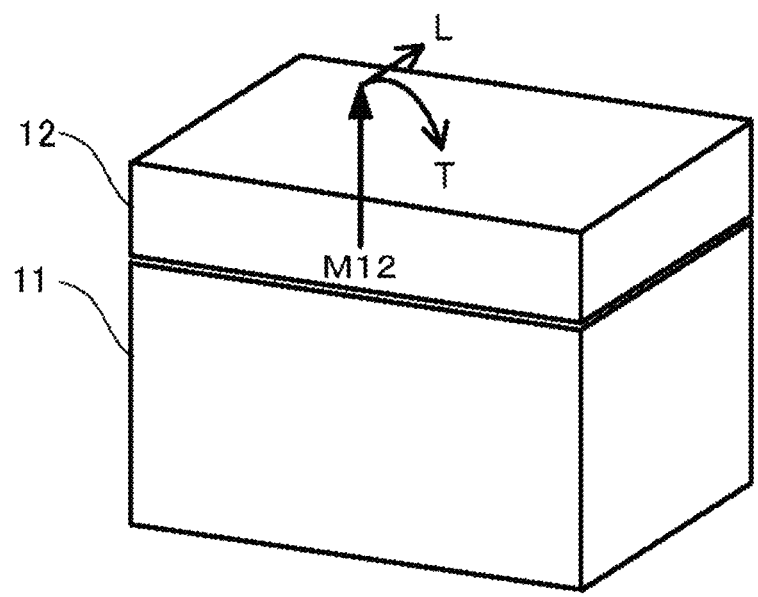
Figure 8C:
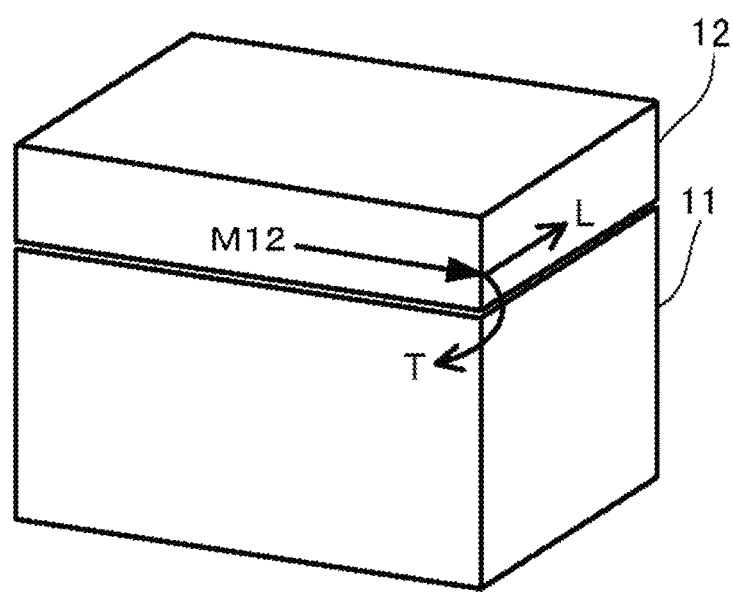
Figure 8D:
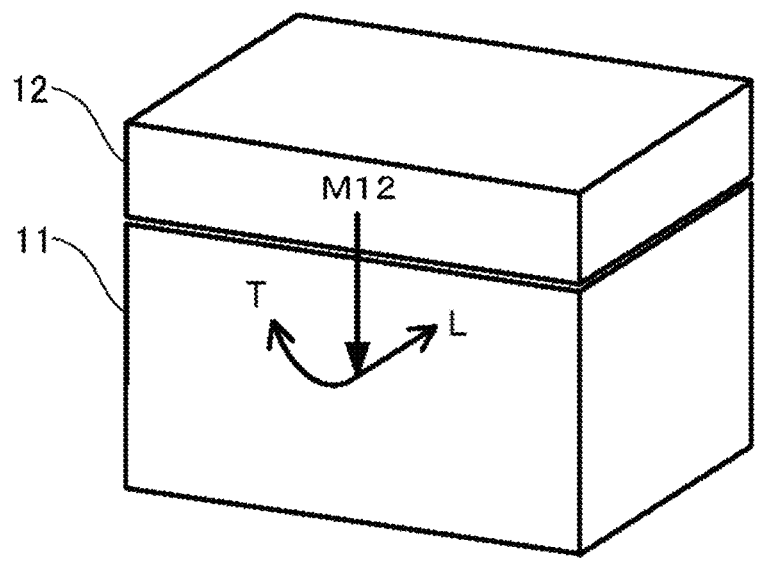
Figure 8E:
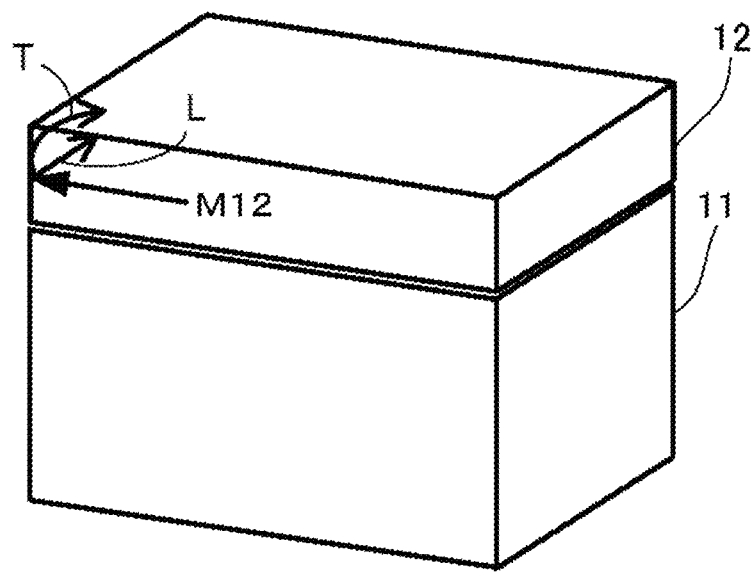

At this time, the state shown in FIG. 8B, that is, the state in which the magnetic field M12 faces the +Z axis direction, switches to a state whereby the longitudinal effective magnetic field causes the magnetization M12 to rotate in the +X axis direction, transitions through the state shown in FIG. 8C, and ends in a state whereby the magnetic field M12 faces the −Z axis direction shown in FIG. 8D. In the state shown in FIG. 8D, the longitudinal effective magnetic field acts in the −X axis direction, but the static magnetic field Ho that acts in the +X axis direction is also in effect, and thus, the magnetization M12 does not rotate anymore. Therefore, the state shown in FIG. 8D is the final state.

On the other hand, if, in the state shown in FIG. 8D, the direction of the writing current Iw passed through the bias layer 11 is changed, the direction of the longitudinal effective magnetic field changes to the opposite direction. As a result, the magnetization M12 changes from the state shown in FIG. 8D, transitions through the state shown in FIG. 8C, and ends in the state shown in FIG. 8B and settles in this state.

On the other hand, if the direction of the static magnetic field Ho is the −X axis direction and the writing current Iw and the active magnetic field are similar to the example described above, then the state shown in FIG. 8C would not be allowed to happen. In this case, according to the direction of the writing current Iw, the state shown in FIG. 8D transitions through the state shown in FIG. 8E and ends up in the state shown in FIG. 8B, or the state shown in FIG. 8B transitions through the state shown in FIG. 8E and ends up in the state shown in FIG. 8D. As a result, it is possible to settle in the state shown in FIG. 8B or the state shown in FIG. 8D according to the direction of the current Iw.

The above was a description of the spin Hall effect, but even with the Rashba effect, both the longitudinal effective magnetic field and the transverse effective magnetic field act on the magnetization M12. Thus the process of reversal in the magnetization direction is the same as the description above. Also, as long as a longitudinal effective magnetic field is generated by a current, it is possible to control the magnetization direction by the mode described here, even with an effect other than the spin Hall effect or the Rashba effect.

The magnetoresistance effect element 100 of the present embodiment has in common with the magnetoresistance effect element disclosed in the specification of US Patent Application Publication No. 2012/0018822 the fact that in-plane direction spin perpendicular to the direction of magnetization is applied to the recording layer, and differs from the magnetoresistance effect element disclosed in Japanese Unexamined Patent Application Publication (Translation of PCT Application) No. 2013-541219 in which spin that is antiparallel to the direction of magnetization is applied to the recording layer. If antiparallel spin is applied to the recording layer, the magnetization direction of the recording layer reverses due to precession. Thus, magnetization direction reversal occurs at the nanosecond level, and therefore, a large current is required. On the other hand, if perpendicular direction spin is applied to the recording layer, then nanosecond level increase in the threshold current is kept small, which is suitable for realizing high speed operation (see Applied Physics Letters, Vol. 104, 072413 (2014)) In general, when rewriting information using a transverse effective magnetic field, a pulse width of 10 nanoseconds or greater is required. By contrast, according to the configuration of the above-mentioned embodiment, by rewriting information with a longitudinal effective magnetic field, it is possible to perform rewriting with a pulse width of 0.1 nanoseconds to less than 10 nanoseconds, enabling high speed rewriting characteristics. Even if the pulse width of the rewriting current Iw were in the range of 10 nanoseconds to 30 nanoseconds, it is possible to maintain a rewriting speed comparable to that of rewriting by applying the conventional antiparallel direction spin.

Next, a configuration example of a memory cell circuit using the magnetoresistance effect element 100 having the above configuration as the memory element will be described with reference to FIG. 9.

Figure 9:
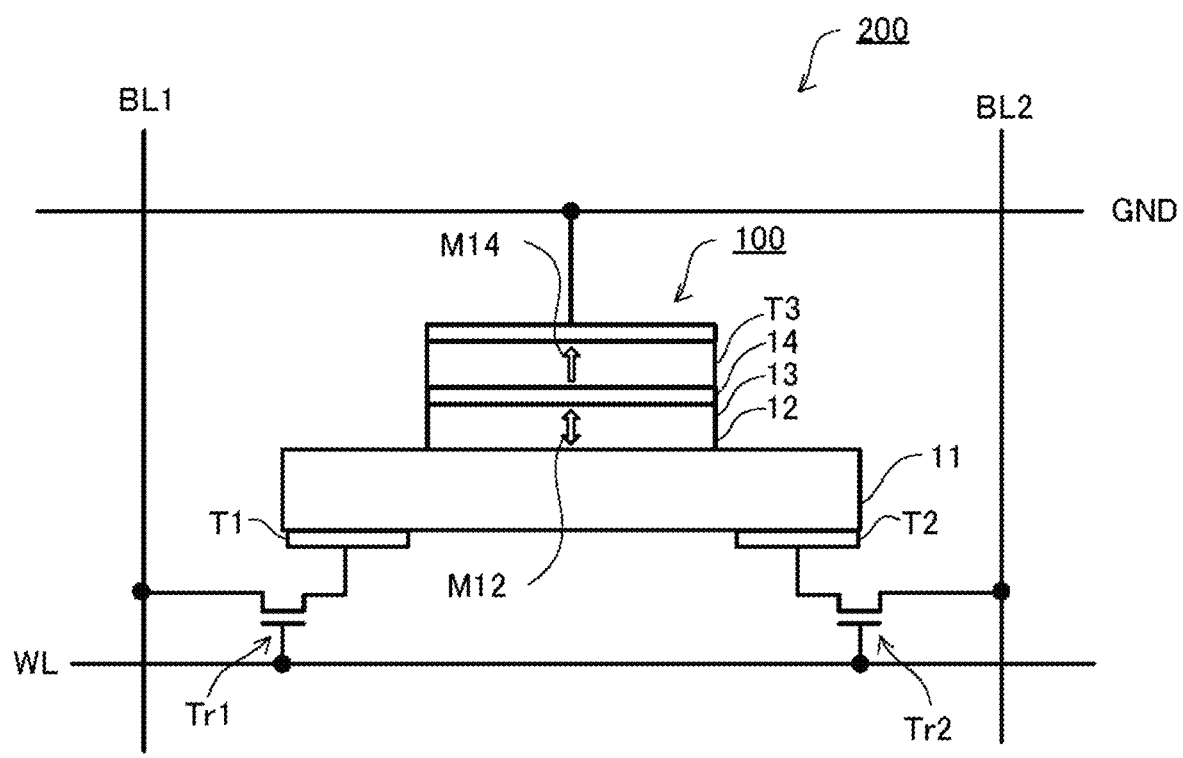
FIG. 9 is an example showing a circuit structure of 1 bit of a memory cell circuit using the magnetoresistance effect element according to Embodiment 1.

FIG. 9 shows a configuration of one bit of a magnetic memory cell circuit 200. The magnetic memory cell circuit 200 includes a magnetoresistance effect element 100 constituted of one bit of memory cell, a pair of bit lines BL1 and BL2, a word line WL, a ground line GND, a first transistor Tr1, and a second transistor Tr2.

The magnetoresistance effect element 100 has a three-terminal structure in which a first terminal T1 is connected to one end of the bias layer 11, a second terminal T2 is connected to the other end, and a third terminal T3 is disposed on the reference layer 14.

The third terminal T3 is connected to the ground line GND. The first terminal T1 is connected to the drain of the first transistor Tr1, and the second terminal T2 is connected to the drain of the second transistor Tr2. The gate electrodes of the first transistor Tr1 and the second transistor Tr2 are connected to the word line WL. The source of the first transistor Tr1 is connected to the first bit line BL1, and the source of the second transistor Tr2 is connected to the second bit line BL2.

When writing information to the magnetoresistance effect element 100, first, in order to select the magnetoresistance effect element 100, an active level voltage is applied to the word line WL to turn on the transistors Tr1 and Tr2. Here, the transistors Tr1 and Tr2 are constituted of an N-channel MOS transistor. In this case, the word line WL is set to a high level. As a result, the first transistor Tr1 and the second transistor Tr2 are turned on. Meanwhile, according to the data to be written, one of the first bit line BL1 and the second bit line BL2 is set to a high level and the other is set to ground level.

Specifically, when writing "1" as data, the first bit line BL1 is set to a low level and the second bit line BL2 is set to a high level. As a result, as shown in FIG. 4A, the writing current Iw flows in the forward direction, and as shown in FIG. 4B, "1" is written as data.

On the other hand, when writing "0" as data, the first bit line BL1 is set to a high level and the second bit line BL2 is set to a low level. As a result, as shown in FIG. 5A, the writing current Iw flows in the reverse direction, and as shown in FIG. 5B, "0" is written as data.

In this manner, bit data is written to the magnetoresistance effect element 100.

On the other hand, when reading information stored in the magnetoresistance effect element 100, the word line WL is set to an active level and the first transistor Tr1 and the second transistor Tr2 are turned on. Also, both the first bit line BL1 and the second bit line BL2 are set to a high level or one of the first bit line BL1 and the second bit line BL2 is set to a high level and the other is set to an open state. As a result of the high level bit line, current flows through the bias layer 11, the recording layer 12, the barrier layer 13, the reference layer 14, the third terminal T3, and the ground line GND in that order. By measuring the size of the current, the resistance of the path from the bias layer 11 to the reference layer 14, or in other words, the stored data is determined.

The configuration and circuit operation of the magnetic memory cell circuit 200 described here is one example, and can be modified as appropriate. The ground can be set to a reference voltage other than ground voltage, for example. Also, a configuration may be adopted in which the third terminal T3 is connected to a third bit line (not shown) instead of the ground line GND, and when reading, the word line WL is set to a high level, the third bit line is set to a high level, and one or both of the first bit line and second bit line is/are set to ground level, and current is passed from the third bit line to the first bit line BL1 and the second bit line BL2.

Next, the configuration of the magnetic memory device 300 provided with a plurality of the magnetic memory cell circuits 200 illustrated in FIG. 9 will be described with reference to FIG. 10.

Figure 10:
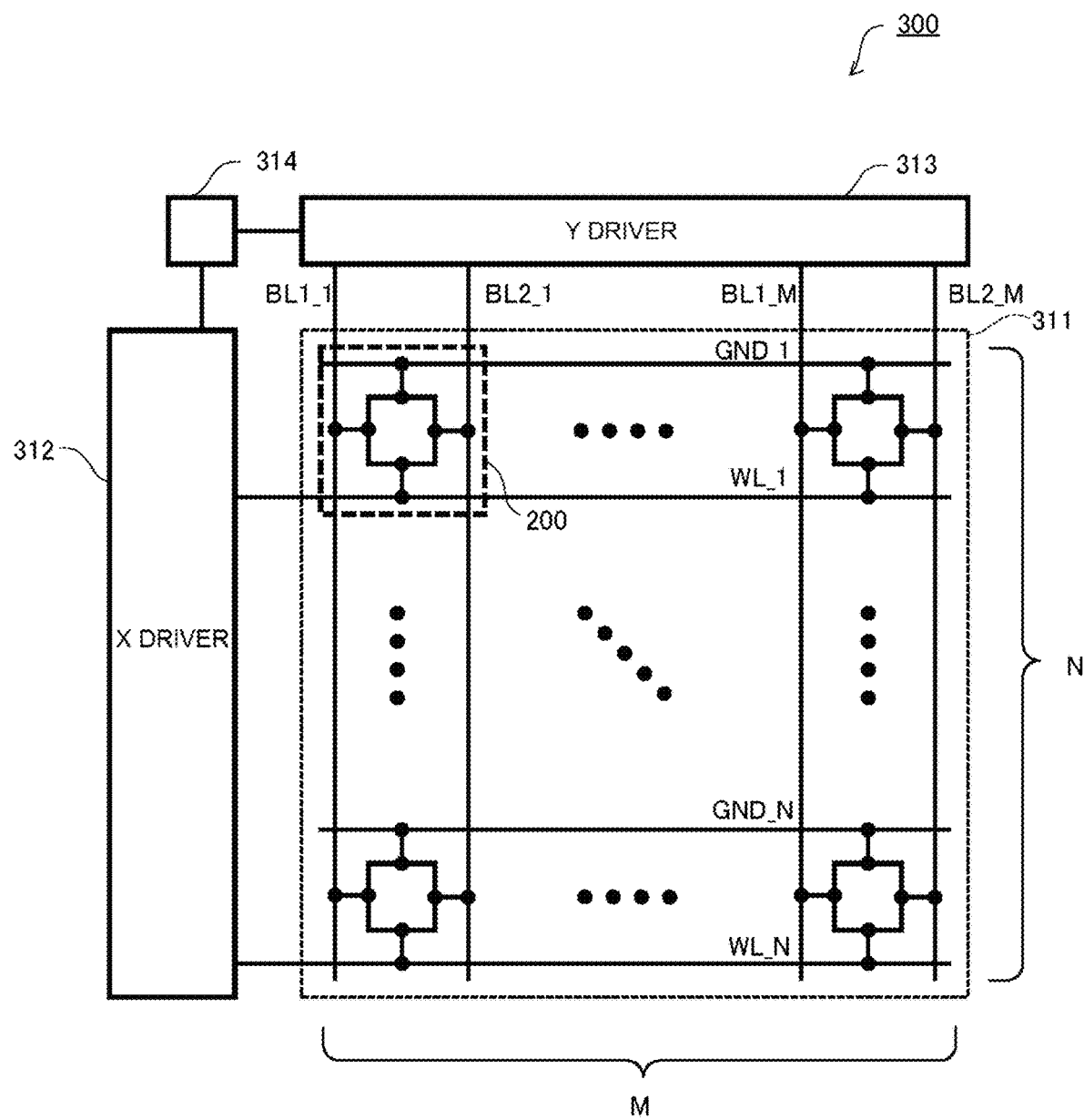
FIG. 10 is a block diagram of a magnetic memory device in which a plurality of the memory cell circuits shown in FIG. 9 are disposed.

As shown in FIG. 10, the magnetic memory device 300 includes a memory cell array 311, an X driver 312, a Y driver 313, and a controller 314. The memory cell array 311 has the magnetic memory cell circuits 200 arranged in an array of N rows and M columns. Each column of magnetic memory cell circuits 200 is connected to a pair including the first bit line BL1 and second bit line BL2 of the corresponding column. Each row of magnetic memory cell circuits 200 is connected to the word line WL and the ground line GND of the corresponding row.

The X driver 312 is connected to a plurality of word lines WL, receives a row address, decodes the row address, and drives the word line WL of the row being accessed so as to be at an active level (if the first transistor Tr1 and the second transistor Tr2 are N-channel MOS transistors, then the word line is set to a high level).

The Y driver 313 functions as a means for writing data to the magnetoresistance effect element 100 as well as a means for reading data from the magnetoresistance effect element 100. The Y driver 313 is connected to a plurality of first bit lines BL1 and second bit lines BL2. The Y driver 313 i) receives a column address, ii) decodes the column address, and iii) sets the first bit line BL1 and the second bit line BL2 connected to the magnetic memory cell circuit 200 being accessed to a data writing state or a data reading state. In other words, when writing "1" as data, the Y driver 313 sets the first bit line BL1 connected to the magnetic memory cell circuit 200 to which data is to be written to a low level and sets the second bit line BL2 connected to the same magnetic memory cell circuit 200 to a high level. When writing "0" as data, the first bit line BL1 is set to a high level and the second bit line BL2 is set to a low level.

Furthermore, when reading information stored in the magnetic memory cell circuit 200, the Y driver 313 sets both the first bit line BL1 and the second bit line BL2 to a high level or sets one of the first bit line BL1 and the second bit line BL2 to a high level and the other to an open state. At this time, the current flowing through the bit lines BL1 and BL2 is compared with a reference value to determine the resistance state of each column of magnetic memory cell circuits 200, and the stored data is read.

The controller 314 controls the X driver 312 and the Y driver 313 according to whether data is being written or read.

The ground line GND connected to the reference layer 14 of the magnetoresistance effect element 100 is connected to the X driver 312, but, as mentioned above, this can be replaced by a read-out bit line connected to the Y driver 313.

Embodiment 2

In order to read or write stored data in a stable manner in the magnetoresistance effect element 100 according to Embodiment 1, the direction of magnetization M14 of the reference layer 14 needs to be fixed in a stable manner. In stabilizing the magnetization M14 of the reference layer 14, it is effective to use a laminated ferri-coupling layer as the reference layer 14.

Figure 11A:
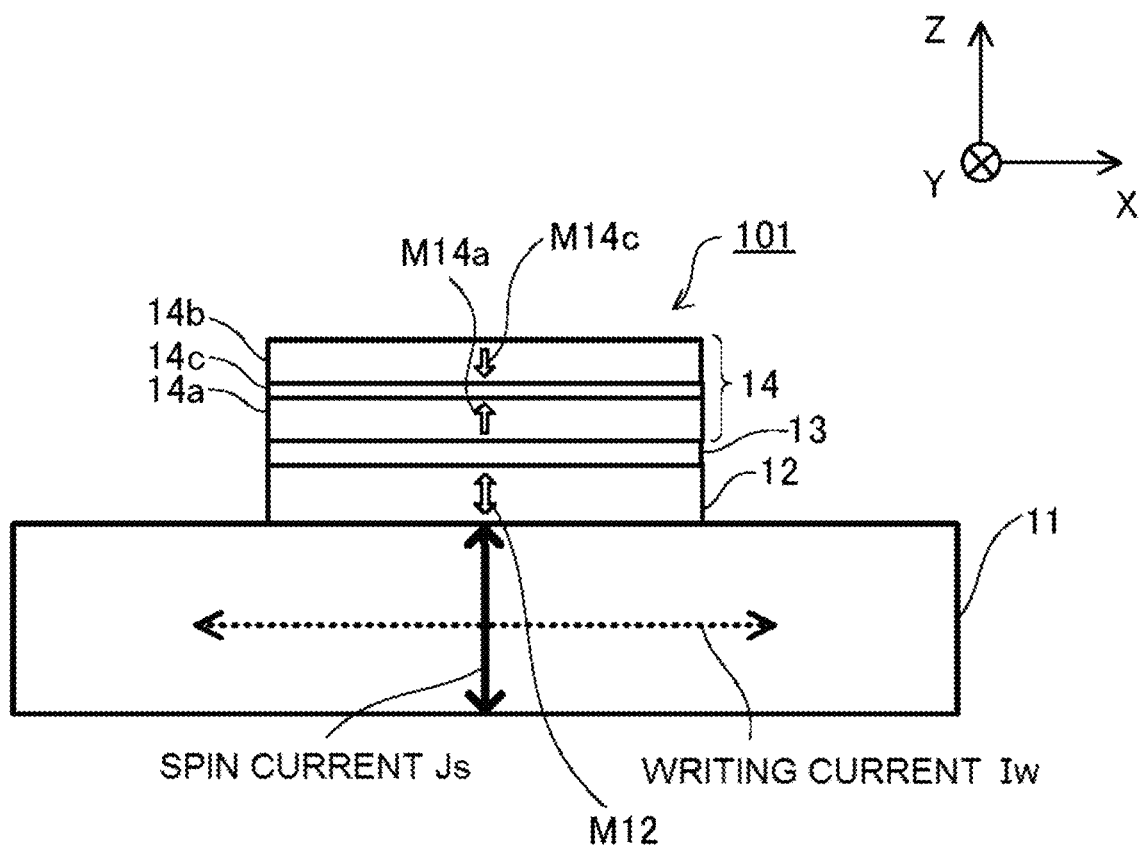
FIGS. 11A to 11C show a configuration of a magnetoresistance effect element according to Embodiment 2 in which the reference layer has a multilayer structure.
Figure 11B:
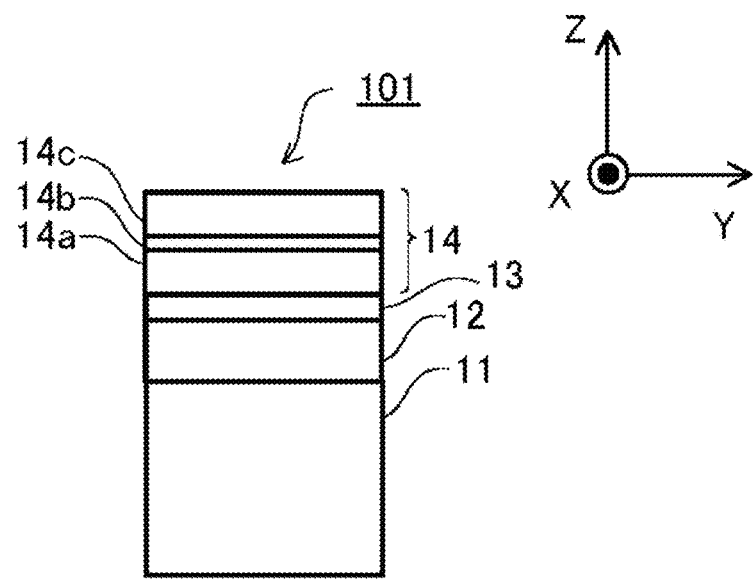
Figure 11C:
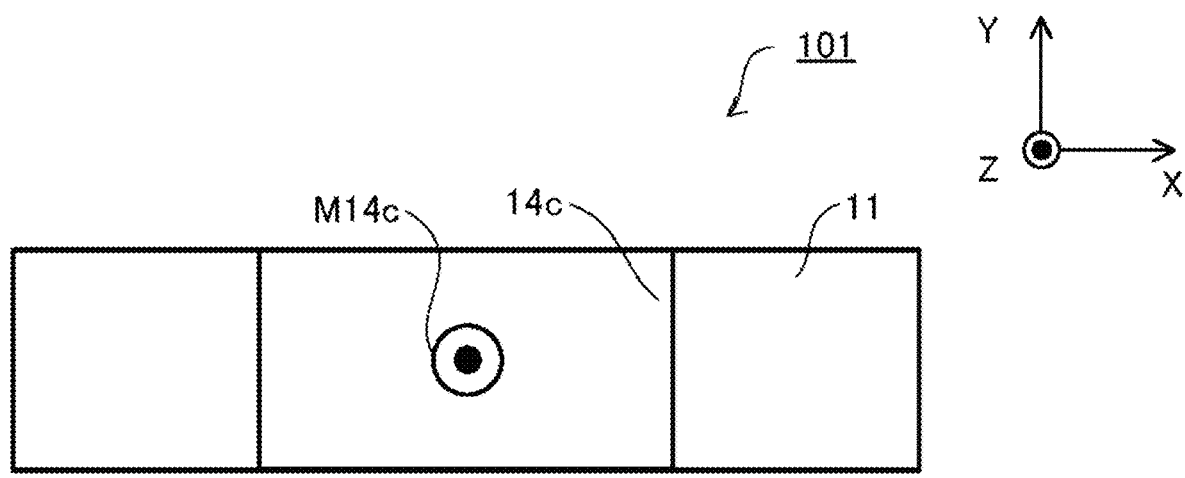

Below, a magnetoresistance effect element 101 in which the reference layer 14 is a laminated ferri-coupling layer will be described below with reference to FIGS. 11A to 11C.

In the present embodiment, the reference layer 14 is formed by layering a ferromagnetic layer 14a, a coupling layer 14b, and a ferromagnetic layer 14c, and has a laminate structure formed by laminate ferri-coupling. The ferromagnetic layer 14a and the ferromagnetic layer 14c are coupled in an antiferromagnetic manner by the coupling layer 14b. Other aspects are essentially similar to Embodiment 1.

It is preferable that the ferromagnetic layer 14a and the ferromagnetic layer 14c be made of a ferromagnetic material containing Fe, Co, and Ni. It is preferable that the coupling layer 14b contain Ru, Ir, or the like.

By this configuration, when the direction of magnetization M12 of a recording layer 12 matches the direction of magnetization M14a of the ferromagnetic layer 14a, which is closer to the recording layer 12 among the ferromagnetic layers 14a and 14c constituting the reference layer 14, the magnetoresistance effect element 101 enters a parallel state and a low resistance state. On the other hand, when the direction of magnetization M12 of a recording layer 12 is opposite to the direction of magnetization M14a of the ferromagnetic layer 14a, the magnetoresistance effect element 101 enters an antiparallel state and a high resistance state.

In Embodiments 1 and 2, exchange bias occurs due to the bias layer 11, and thus, there is no need to provide an extra mechanism for applying an external magnetic field to the recording layer 12. Thus, in a recording device or the like using the magnetoresistance effect elements 100 and 101, it is possible to have a simplified configuration compared to that including a mechanism for applying an external magnetic field.

Also, there is no need for the Y axis direction, which is the widthwise direction of the conductive bias layer 11, to be the lengthwise direction of the recording layer 12, and thus, compared to a configuration in which the lengthwise direction of the conductive layer is substantially perpendicular to the lengthwise direction of the recording layer (configuration in which the writing current and the magnetization direction of the recording layer are at a right angle to each other), the cell area can be made small.

The present invention is not limited to the embodiments above, and various modifications can be made thereto. Below, modification examples and application examples of the present invention will be explained.

Modification Example 1

The resistance and allocation of data in the magnetoresistance effect element can be selected arbitrarily, and the low resistance state may be assigned a data value of "1" with the high resistance state being assigned a data value of "0".

Modification Example 2

Figure 12A:
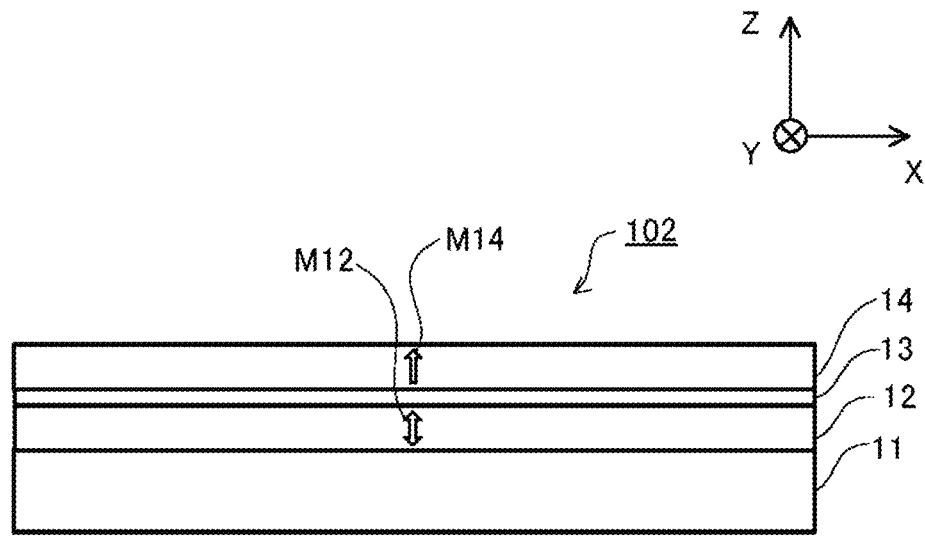
FIGS. 12A and 12B show a modification example of the laminate structure of the magnetoresistance effect element.
Figure 12B:
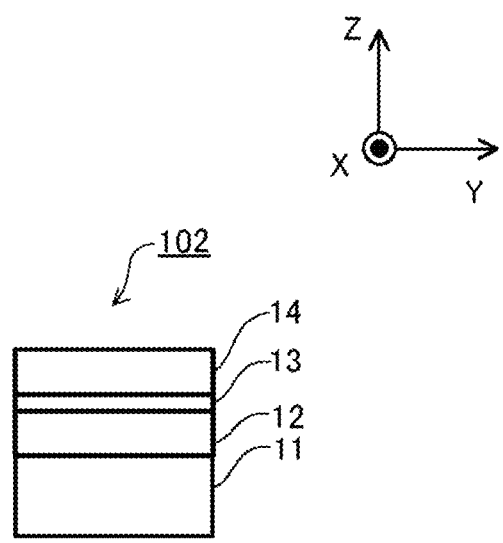

In the above example, a case was described in which the recording layer 12 and the like are layered on a portion of the top surface of the bias layer 11, but as shown in FIGS. 12A and 12B, the recording layer 12 and the like may be layered on the entire top surface of the bias layer 11. In such a case, it is easy to manufacture the laminate.

Figure 12C:
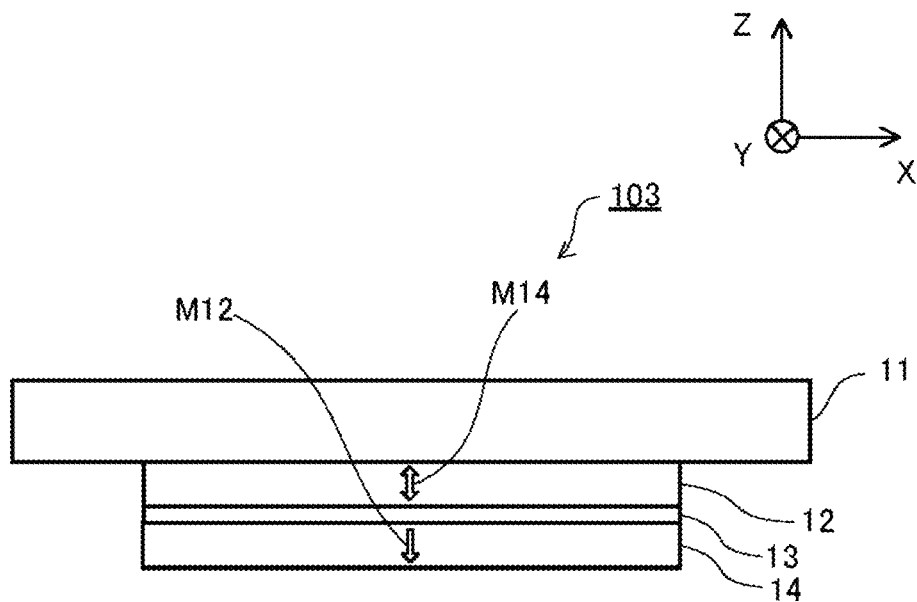
FIGS. 12C and 12D show a modification example in which the order in which the layers are stacked in the magnetoresistance effect element is reversed.
Figure 12D:
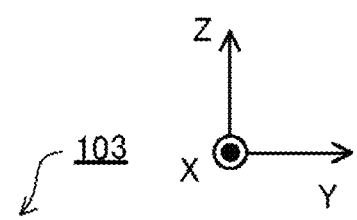
Figure 12D:
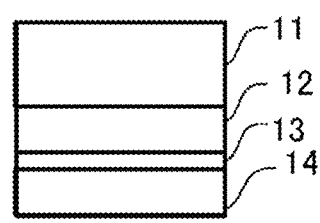

Also, there is no need to have the bias layer 11 be the bottommost layer, and as shown in FIGS. 12C and 12D, the layers may be stacked in the following order from the bottom: the reference layer 14, the barrier layer 13, the recording layer 12, and the bias layer 11.

Modification Example 3

Figure 13:
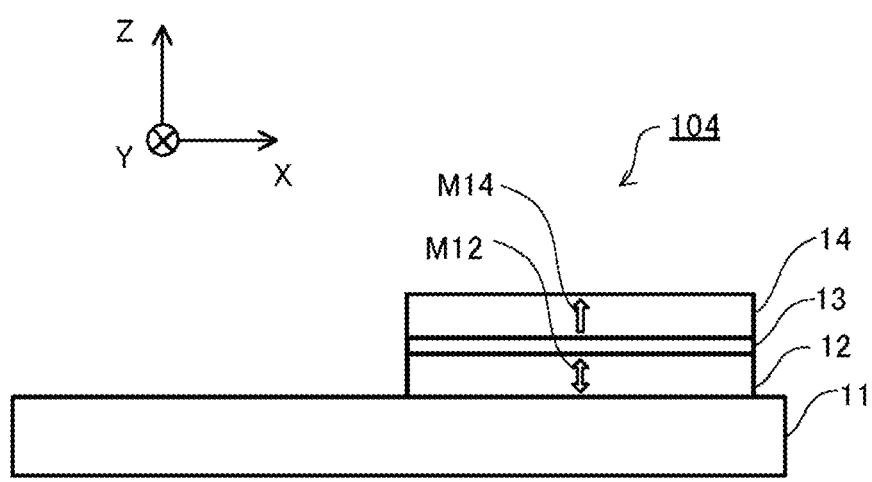
FIG. 13 shows a modification example of an arrangement position of the recording layer on the bias layer.

In the above example, the recording layer 12 and the like are layered in the center in the lengthwise direction of the bias layer 11, but as shown in FIG. 13, the recording layer 12 and the like may be layered at a position offset from the center in the lengthwise direction the bias layer 11.

Modification Example 4

Figure 14A:
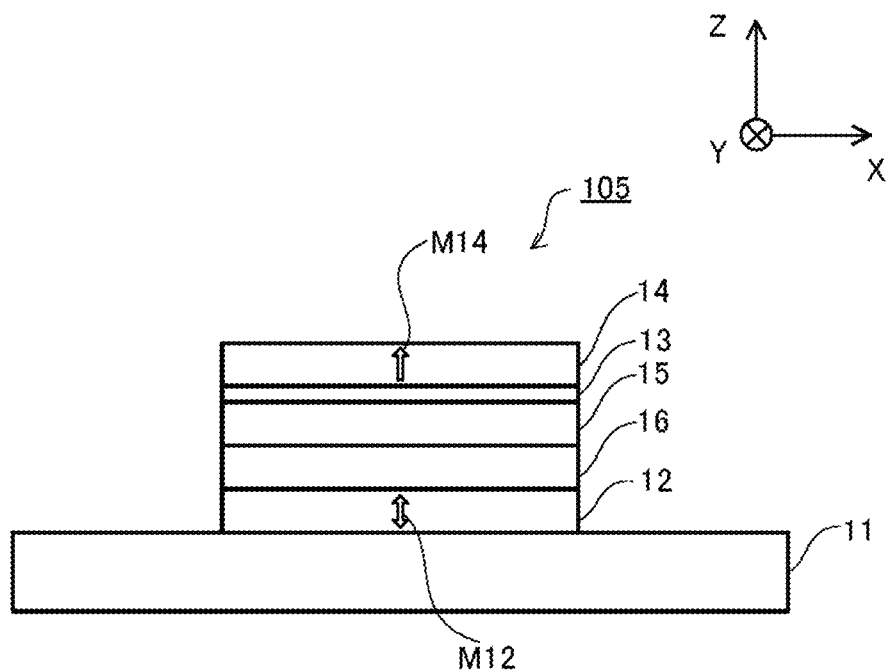
FIGS. 14A and 14B show a modification example in which a sensor layer 15 and a conductive layer 16 are provided between a recording layer 12 and a barrier layer 13.
Figure 14B:
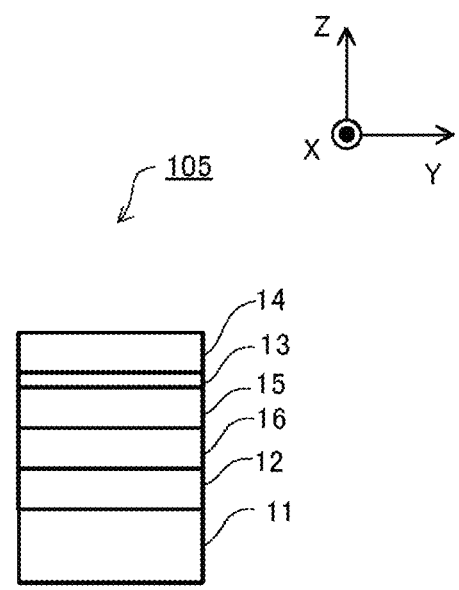

In the magnetoresistance effect element 100, it is preferable that the recording layer 12 have excellent characteristics for the following two aspects. The first aspect pertains to writing, and it is preferable that magnetization direction be able to be reversed with a small current and short pulse width. The second aspect pertains to reading, and it is preferable that the tunnel magnetoresistance effect ratio (TMR ratio), corresponding to the difference in resistance between the parallel and antiparallel states for magnetization when a current is flowing between the recording layer 12, the barrier layer 13, and the reference layer 14, be high. In order to independently design both reading and writing characteristics and attain excellent characteristics, a sensor layer 15 and a conductive layer 16 may be provided between the recording layer 12 and the barrier layer 13 as shown in FIGS. 14A and 14B.

The sensor layer 15 may be designed such that the TMR ratio is high by providing the sensor layer 15 and the conductive layer 16. Meanwhile, the recording layer 12 may be designed so as to allow for good writing characteristics. In other words, it becomes possible to design these aspects independently and improve ease of manufacturing. The sensor layer 15 is magnetically coupled with the recording layer 12. Magnetostatic interaction can be used as the coupling mode, for example.

The sensor layer 15 is a layer for sensing the magnetic field of the recording layer 12, and the axis of easy magnetization thereof is perpendicular to the layer surface, as in the recording layer 12. The sensor layer 15 is made of a material with excellent reading characteristics. The conductive layer 16 is a layer for electrically connecting the recording layer 12 with the sensor layer 15. The conductive layer 16 is made of a material that is compatible with the recording layer 12 and the sensor layer 15. If a Co/Ni multilayer film is used for the recording layer 12, then Ta or the like can be used for the conductive layer 16.

As a result of a reversal in magnetization method for the recording layer 12, a magnetic field leaks from the recording layer 12, and this leaked magnetic field is transmitted to the sensor layer 15 through the conductive layer 16. In response to the magnetic field, the magnetization method for the sensor layer 15 reverses up and down. When reading data from the recording element, the magnetization direction of the sensor layer 15, for which a material with excellent reading characteristics is used, may be detected. By adding the sensor layer 15 and the conductive layer 16 to the magnetoresistance effect element 100, both reading and writing characteristics can be improved.

Figure 14C:
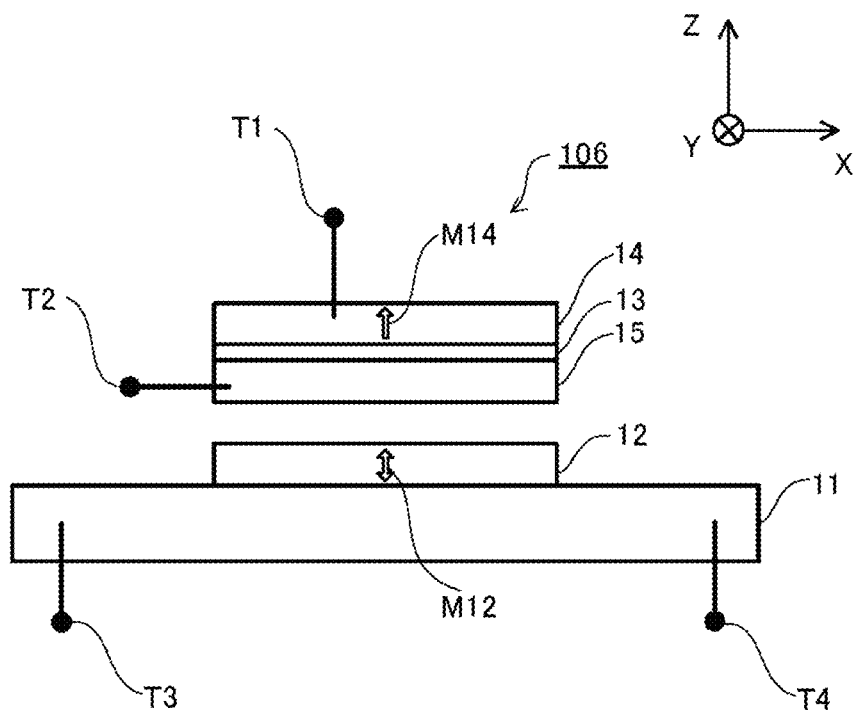
FIGS. 14C and 14D show a modification example in which a sensor layer 15 is provided between a recording layer 12 and a barrier layer 13.
Figure 14D:
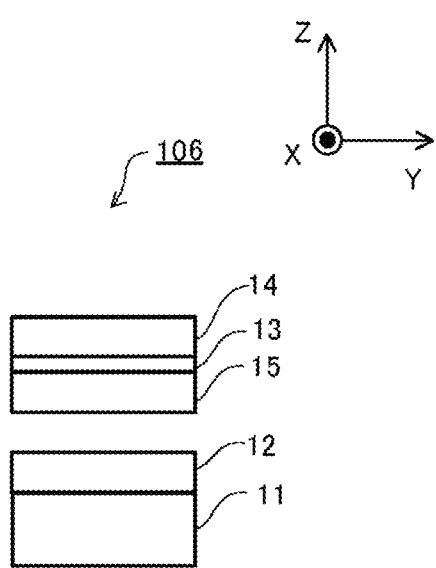

As shown in FIGS. 14C and 14D, only the sensor layer 15 may be added as well. In such a case as well, it is possible to design the recording layer 12 only on the basis of writing characteristics, similar to the example shown in FIGS. 14A and 14B. Furthermore, reading characteristics are also improved by the sensor layer 15.

Here, a four-terminal structure is adopted in which a terminal T1 is provided to the reference layer 14, a terminal T2 is provided to the sensor layer 15, a terminal T3 is provided on one end of the bias layer 11 in the lengthwise direction, and a terminal T4 is provided on the other end of the bias layer 11 in the lengthwise direction. When reading, a read-out current is passed between the terminal T1 and the terminal T2, and when writing, a writing current is passed between the terminal T3 and the terminal T4. By adopting such a configuration, the current path during reading and the current path during writing are independent of each other. In this manner, it is possible to perform reading and writing simultaneously, and by modifying the circuit in each cell, it is possible to reduce the error rate requirement for 1-bit elements. Also, for reading, both a three-terminal structure and a four-terminal structure have in common the fact that the read-out current is used to determine the tunnel resistance when passing a current in a direction passing through the barrier layer.

Modification Example 5

Figure 15A:
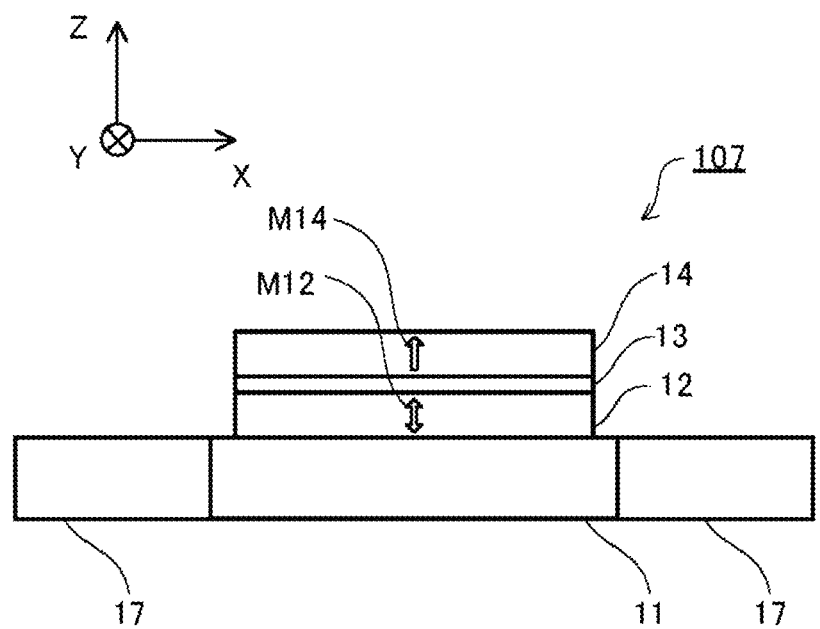
FIGS. 15A and 15B show a modification example in which both ends of a bias layer have a conductive layer.
Figure 15B:
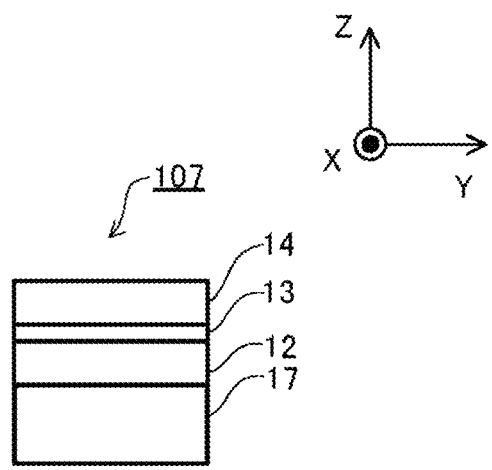

In the examples above, the bias layer 11 is made of a material containing an antiferromagnetic material, but as shown in FIGS. 15A and 15B, both ends in the lengthwise direction of the bias layer 11 may have a conductive layer 17 made of a material containing a conductor. By such a configuration, it becomes easier to pass a writing current.

Modification Example 6

Figure 16A:
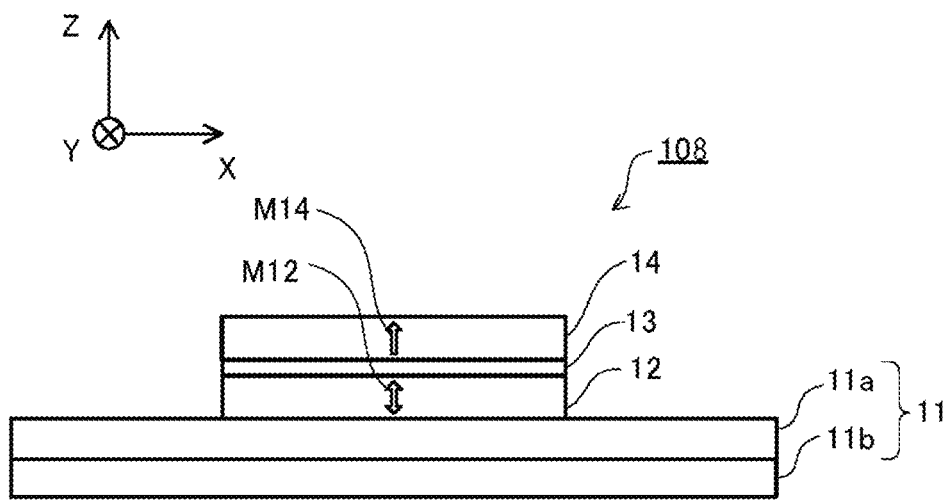
FIGS. 16A and 16B show a modification example in which a bias layer has a two-layer structure.
Figure 16B:
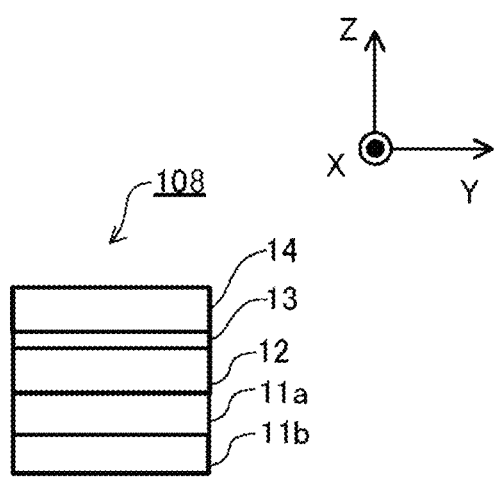

As shown in FIGS. 16A and 16B, the bias layer 11 may have a two-layer structure including a first bias layer 11a containing an antiferromagnetic material, and a second bias layer 11b made of a high spin Hall effect material.

Examples of the antiferromagnetic material contained in the first bias layer 11a include Cr, Mn, Cr—O, Mn—O, Fe—O, Fe—Mn, and the like.

Examples of a high spin Hall effect material contained in the second bias layer 11b include Pt, W, Ta, Ir, and the like.

If the bias layer 11 has a two-layer structure, this improves design flexibility for the bias layer 11 and improves ease of manufacturing, while additionally enabling design such that the size of the current and the pulse width used for writing are reduced.

Figure 17A:
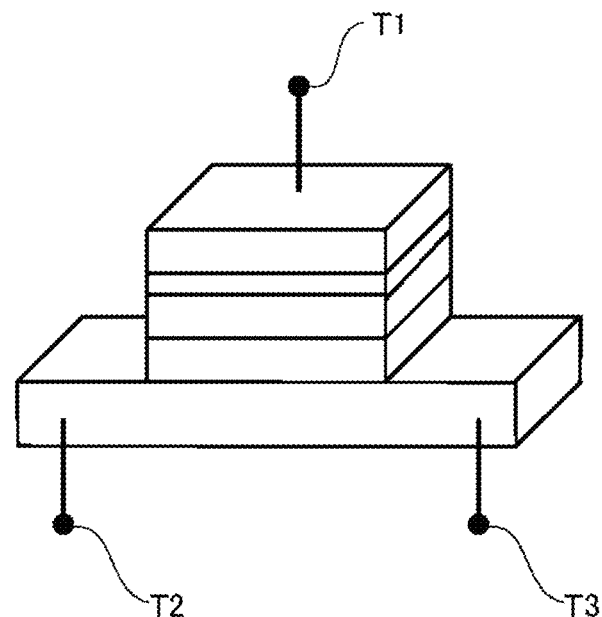
FIGS. 17A to 17C show an example of arrangement positions of terminals in a three-terminal structure.
Figure 17B:
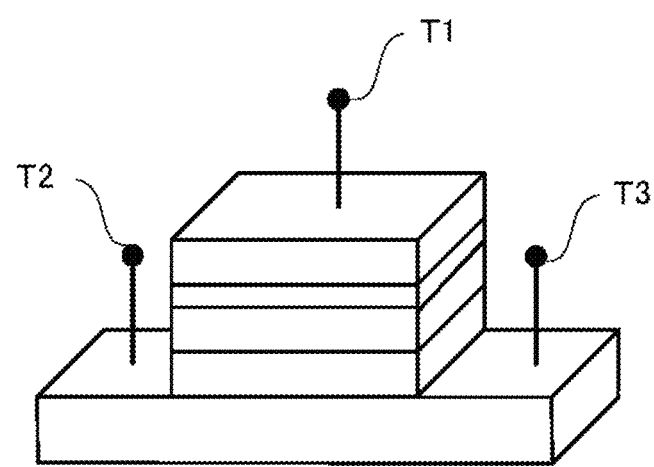
Figure 17C:
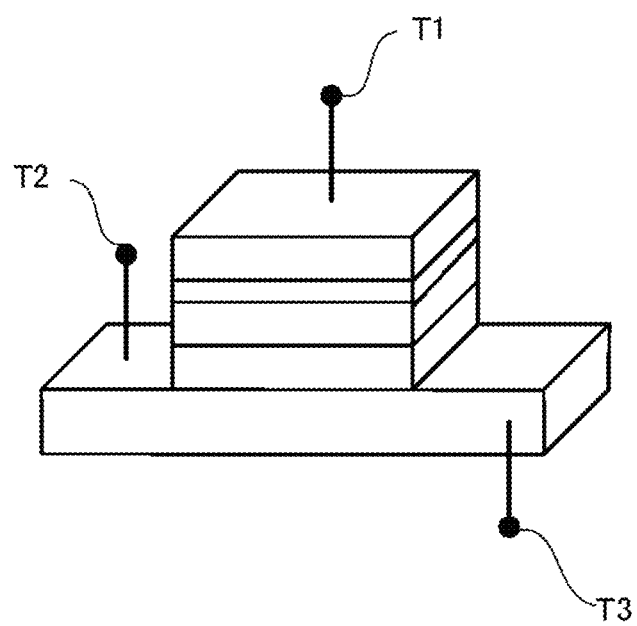

The positions to provide the terminals of the magnetoresistance effect element 100 can be appropriately modified. For example, in the magnetoresistance effect element 100 shown in FIG. 17A, a terminal T1 is provided on the top surface of the reference layer, a second terminal T2 is provided on the bottom surface-side of the bias layer on one end of the bias layer 11 in the lengthwise direction, and a third terminal T3 is provided on the bottom surface-side of another end of the bias layer 11 in the lengthwise direction. Also, in the magnetoresistance effect element 100 shown in FIG. 17B, the second terminal T2 and the third terminal T3 are disposed on the top surface of the bias layer 11 at the ends thereof in the lengthwise direction. The magnetoresistance effect element 100 shown in FIG. 17C is provided with the second terminal T2 disposed on the top surface of the bias layer 11 at one end thereof in the lengthwise direction, and a third terminal T3 disposed on the bottom surface of the bias layer at another end of the bias layer 11. In any of the configurations, the magnetization direction reversal resulting from exchange bias and spin-orbit torque by the bias layer 11 act similarly.

Modification Example 7

A base layer and a seed layer may be provided below the bias layer 11 and a cap layer may be provided over the reference layer 14. The base layer can contain Ti, V, Cr, Zr, Nb, Mo, Hf, Ta, W, or the like. The seed layer can contain Cr, Fe, Co, Ni, NiFe, Ru, Rh, Pd, Ag, Cu, Ir, Pt, Au, or the like. The cap layer can contain Ta, Ru, Cu, Pt, or the like.

Modification Example 8

Figure 18:
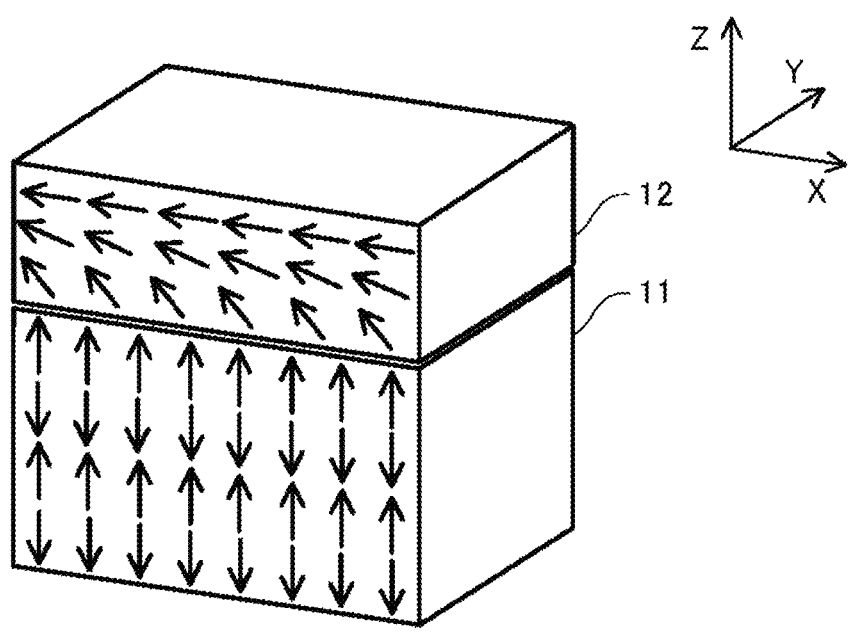
FIG. 18 is for describing the effect of exchange bias for when an antiferromagnetic material has a magnetic moment in the vertical direction.

As shown in FIG. 18, the bias layer 11 may have a magnetic moment in the vertical direction. In such a case, the magnetic moments inside the bias layer 11 alternate in direction in the direction perpendicular to the layer surface. At this time, the recording layer 12 adjacent to the bias layer 11 has an in-plane axis of easy magnetization. The magnetization direction of the recording layer 12 rotates to the vertical direction near the interface with the bias layer 11, and moving away from the bias layer 11, the magnetization direction moves towards the axis of easy magnetization of the recording layer 12 itself. In other words, it can be said that a magnetic field in the vertical axis direction is applied to the recording layer 12.

WORKING EXAMPLE

Through experiment, it was determined that the magnetoresistance effect element 100 has the following resistance characteristics.

The magnetoresistance effect element 100 used for the experiment has the following layer configuration. Substrate: Ta, 3 nm; seed layer: Pt, 4 nm; bias layer: PtMn, 8 nm; recording layer: [Co/Ni]$_2$, 0.3 nm for Co, 0.6 nm for Ni; reference layer: Co, 0.3 nm; barrier layer: MgO, 2 nm. Heat treatment conditions include the following, for example— temperature: 300° C., retention time: 2 hours, magnetic flux density: 1.2T.

A current was passed through the magnetoresistance effect element 100 manufactured in this manner, and the change in resistance was measured. Measurement conditions were as follows: no magnetic field, room temperature (20° C.), current pulse width: 1 second; current density in $10^{10}$ A/m$^2$ range.

Figure 19A:
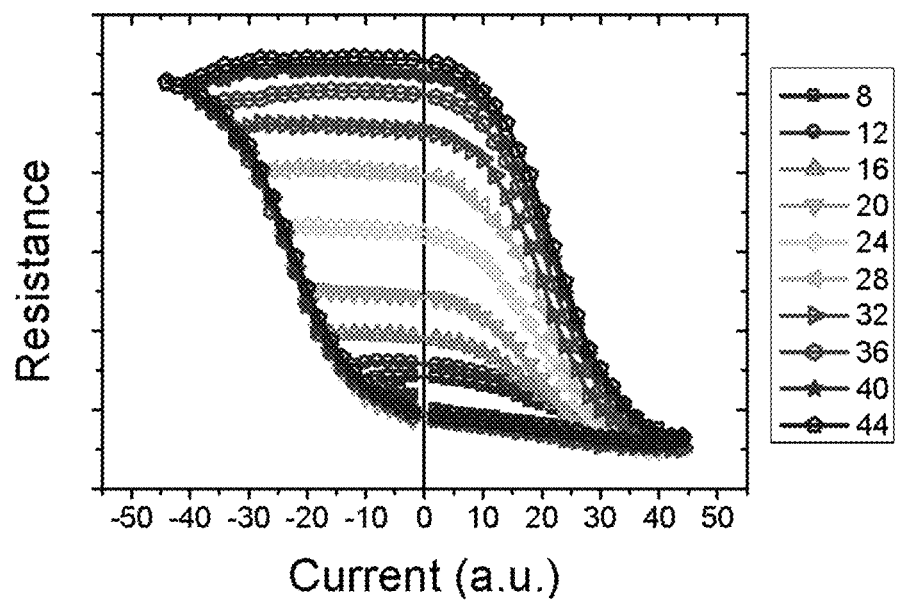
FIGS. 19A and 19B show current-resistance characteristics indicating changes in resistance when a current is passed through a magnetoresistance effect element having a prescribed film thickness configuration.

FIG. 19A shows the relationship between resistance and current when a negative current pulse is passed and then a positive current pulse is passed in a state where the magnetization direction of the recording layer 12 is downward. The amplitude of the current pulse was gradually and intermittently increased from 0 to a certain value, and then gradually reduced back down to 0. The measured resistance is the value after each pulse current was applied.

Figure 19B:
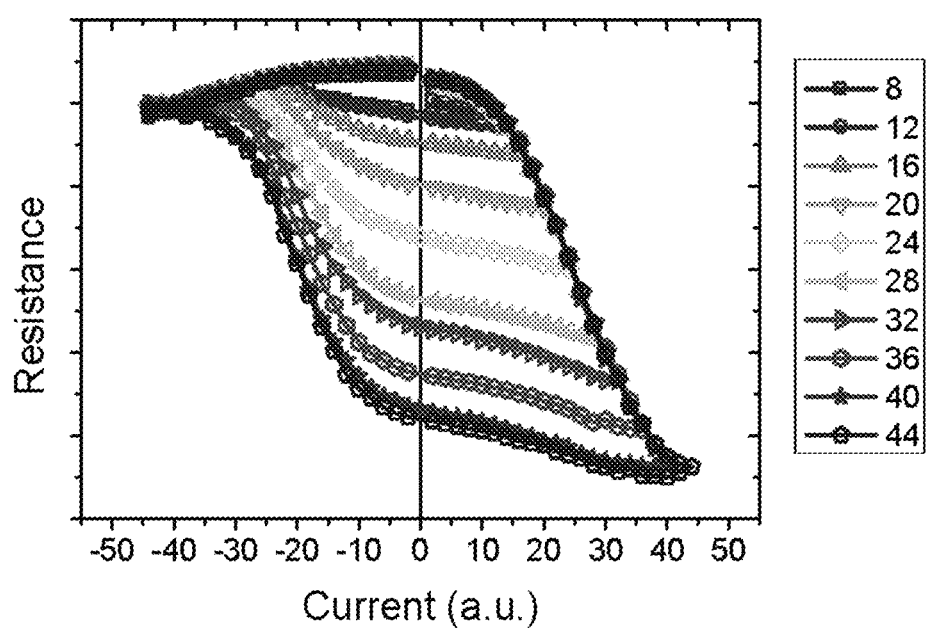

FIG. 19B shows the relationship between resistance and current when a positive current pulse is passed and then a negative current pulse is passed in a state where the magnetization direction of the recording layer 12 is upward. The amplitude of the current pulse was gradually and intermittently increased from 0 to a certain value, and then gradually reduced back down to 0. The measured resistance is the value after each pulse current was applied.

In the experiment, it was confirmed that as a result of the above-mentioned exchange bias, the magnetization direction of the recording layer is reversed without an external magnetic field, and that the resistance changes in an analog manner in relation to the size of the passed current. It was also found that by changing the layer configuration (primarily the thickness of PtMn and Co/Ni), it is possible to form a design such that characteristics suited to digital operation and not analog operation can be attained. Increasing the angularity of the hysteresis loop is effective in realizing digital operation. Decreasing the bias magnetic field and increasing the magnetic anisotropy in a direction perpendicular to the surface of the recording layer 12 are effective in doing so. When the thickness of the PtMn was reduced down to 7 nm and the Pt seed layer was increased in thickness to 5 nm, for example, then it was found that a high angularity hysteresis loop suited to digital operation could be attained.

Devices in which the resistance changes continuously according to the current are referred to as memristors due to having the functions of both a memory and a resistor. It is known that by using a memristor, it is possible to realize, using a compact circuit, information processing such as brain-like information processing that fundamentally differs from the currently used von Neumann information processing architecture. It is known that when using brain-like information processing, complex tasks such as image or voice recognition can be performed in a short period of time and with low power usage.

Thus, the magnetoresistance effect element including a bias layer containing an antiferromagnetic material according to the present invention can be used not only as a device to be used as a framework for existing digital information processing such as magnetic memories, but also as a device that paves the way for new information processing frameworks.

Since the resistance of the magnetoresistance effect element 100 can be set to any value depending on current, it is possible to manufacture not only digital memory unit that stores 0s and is but also multivalued memories that can use three or more values. If the magnetoresistance effect element 100 is used as a multivalued memory that can use N values of 0, 1, 2, . . . , N, then the writing currents Iw0, Iw1, Iw2, . . . , IwN passed through the element to realize the respective resistance values satisfy the following relation: Iw0<Iw1<Iw2< . . . <IwN. If used as a multivalued memory, the magnetoresistance effect element 100 may perform a verify operation such as used in NAND flash memories or the like. In other words, the writing current can be introduced in multiple stages such that the intended resistance values are attained.

Also, whether used as an analog memory or a multivalued memory, an initializing process for initializing the resistance state prior to writing may be provided. As a method for initializing, a current can be passed to individual elements to initialize them to a desired state. In the example shown in FIGS. 19A and 19B, it is possible to initialize to a low resistance state by passing a sufficiently large positive current and to initialize to a high resistance state by passing a sufficiently large negative current. Also, by passing a current of an arbitrary size, passing a current pulse having a sufficiently long pulse width, passing an alternating current that oscillates between positive and negative, or the like, it is possible to initialize the resistance to an intermediate value between maximum resistance and minimum resistance. In addition, by separately providing a mechanism for applying an even magnetic field from outside, it is possible to initialize the resistance state of multiple elements in a block simultaneously.

When realizing brain-like information processing using the magnetoresistance effect element 100, two current pulses may be introduced to the magnetoresistance effect element 100 while adjusting the timing appropriately when writing information. It is known that the coupling load of a synapse in a living organism changes in the positive or negative direction depending on the timing, and this phenomenon is known as "spike timing dependent synaptic plasticity (STDP)". By appropriately designing the magnetoresistance effect element 100 so as to have STDP characteristics in the present invention as well, it is possible to form an artificial synapse element suited to brain-like information processing.

Modification Example 9

Figure 20:
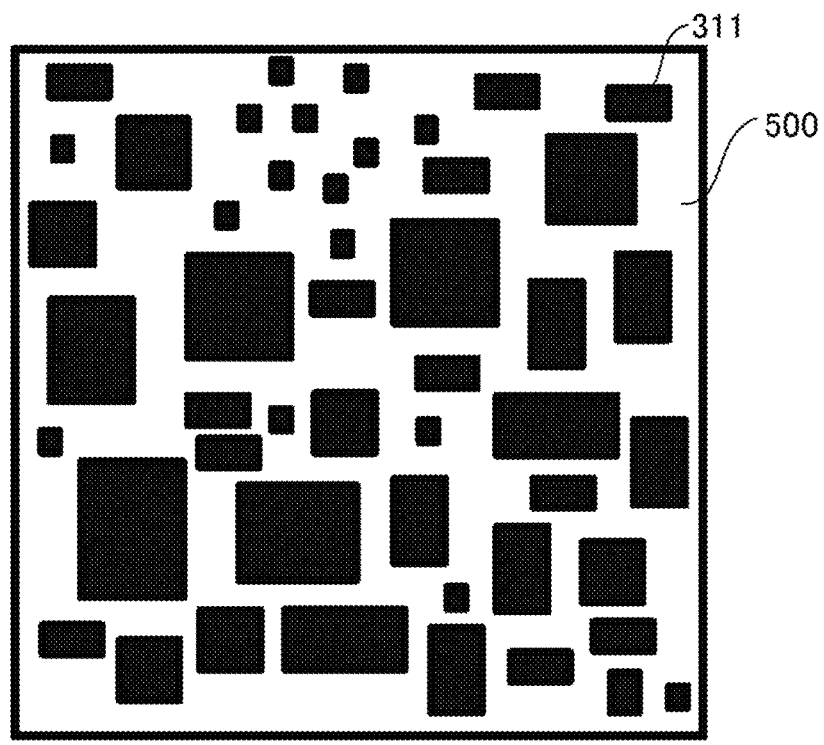
FIG. 20 shows an example of a case in which the magnetoresistance effect element is used in a logic memory.

When the magnetoresistance effect element according to the present invention is used as an analog memory, then it is possible to construct an integrated circuit with a logic-in-memory architecture using this analog memory. Specifically, a magnetoresistance effect element produced so as to operate as an analog memory is constituted as a memory cell array 311 such as shown in FIG. 10, and this memory cell array 311 and individual analog memory elements are arranged in an appropriately distributed manner in the logic circuit as shown in FIG. 20. By using the magnetoresistance effect element produced as an analog memory in a logic-in-memory architecture, it is possible to more efficiently realize brain-like information processing.

Modification Example 10

Figure 21A:
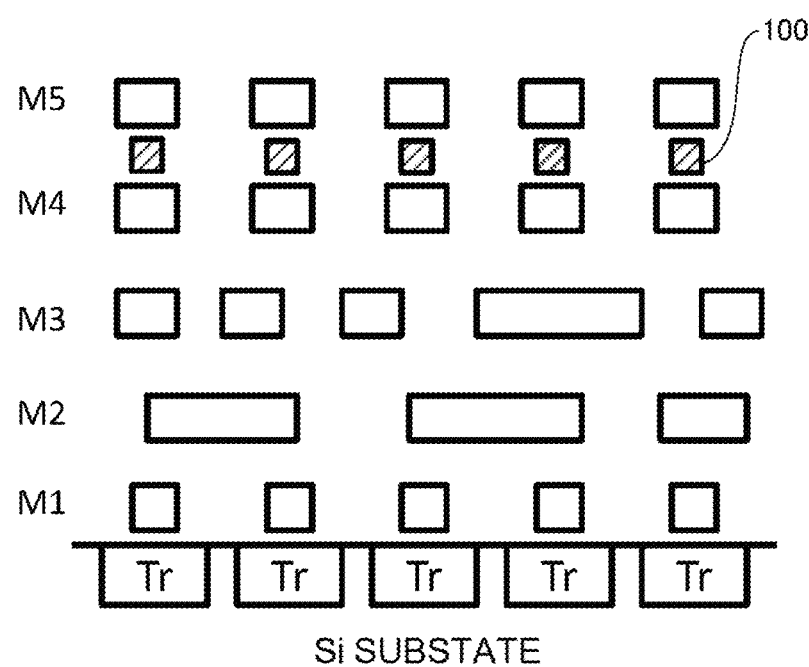
FIGS. 21A and 21B show an arrangement of magnetoresistance effect elements.
Figure 21B:
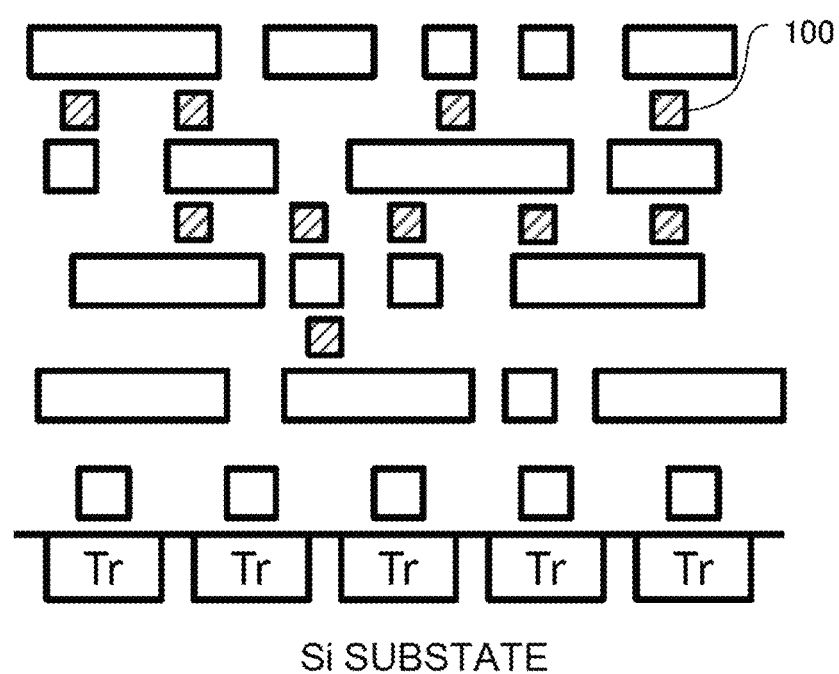

When producing a memory using magnetoresistance effect elements, conventionally a plurality of magnetoresistance effect elements were disposed in the same layer. FIG. 21A shows a schematic cross-sectional view of a conventional memory. Here, the plurality of magnetoresistance effect elements 100 are all arranged between the wiring layers M4 and M5. However, by randomly disposing magnetoresistance effect elements that can also be used as an analog memory in a plurality of layers as shown in FIG. 21B, for example, it is possible to use these magnetoresistance effect elements in brain-like information processing or the like. In FIGS. 21A and 21B, "Tr" represents a transistor. In the drawing, the integrated circuit is shown as being integrated on a Si substrate, but in reality, various substrates can be used. FIGS. 21A and 21B show typical examples of cross-sectional structures of integrated circuits using the present invention, and magnetoresistance effect elements and wiring lines that are not connected in this cross-section are connected in differing positions in the depth direction relative to the plane defined by the page such that suitable operation can be attained.

The above-mentioned embodiments are for describing the present invention, and do not limit the scope of the present invention. That is, the scope of the present invention is not defined by the embodiments, but rather the claims. Various modifications made within the scope of the claims or the scope of an equivalent invention are considered to be within the scope of the present invention.

The present application is based on Japanese Patent Application No. 2015-73178 filed on Mar. 31, 2015, and includes the specification, claims, drawings, and abstract thereof. The entire disclosure of the Japanese Patent Application is included in this specification as reference.

INDUSTRIAL APPLICABILITY

The present invention can be used in the fields of magnetoresistance effect elements, magnetic memory devices, integrated circuits, and the like.

What is claimed is:

1. A magnetoresistance effect element, comprising:
a bias layer comprised of an antiferromagnetic material and having a shape in which a first length in a first direction greater than a second length in a second direction perpendicular to the first direction;
a recording layer comprised of a ferromagnetic material and being disposed on the bias layer, a direction of magnetization of the recording layer being perpendicular to a surface of the recording layer and being reversible;
a barrier layer comprised of an insulation material and being disposed on the recording layer; and
a reference layer comprised of a ferromagnetic material and being disposed on the barrier layer, a direction of magnetization of the reference layer being perpendicular to the surface of the recording layer and being substantially fixed.

2. The magnetoresistance effect element according to claim 1, wherein due to a longitudinal effective magnetic field applied on the recording layer by passing a writing current through the bias layer in a third direction, the direction of magnetization of the recording layer reverses in a direction corresponding to the third direction in which the writing current flows, the third direction including a forward direction and a reverse direction opposite to the forward direction, the forward and reverse directions being parallel to the first direction.

3. The magnetoresistance effect element according to claim 2, wherein the writing current flows along the bias layer in the first direction.

4. The magnetoresistance effect element according to claim 1, wherein, as a result of an exchange bias caused by the bias layer and the recording layer being adjacent to each other, a reversal direction for the direction of magnetization of the recording layer by the longitudinal effective magnetic field is determined.

5. The magnetoresistance effect element according to claim 3, wherein reversal in the direction of magnetization in the recording layer is fixable caused by the longitudinal effective magnetic field applied on the recording layer from the bias layer, without being caused by an external magnetic field.

6. The magnetoresistance effect element according to claim 1, wherein the bias layer includes Pt and Mn, or Ir and Mn, and has a thickness in a range of 1 nm to 15 nm.

7. The magnetoresistance effect element according to claim 1, wherein the recording layer has a structure in which a layer comprised of Co and a layer comprised of Ni are laminated, and has a thickness in a range of 0.8 nm to 5 nm.

8. The magnetoresistance effect element according to claim 1, wherein the bias layer applies an exchange bias to the recording layer.

9. The magnetoresistance effect element according to claim 1, wherein
the bias layer includes a plurality of pairs of magnetic moments, each magnetic moment in each of the pair of magnetic moments having an antiparallel direction to each other, and
the recording layer has an axis of easy magnetization in a direction perpendicular to the antiparallel direction.

10. A magnetic memory device, comprising:
the magnetoresistance effect element according to claim 1;
a writing circuit which writes data to the magnetoresistance effect element by passing a writing current to the magnetoresistance effect element; and a reading circuit which reads data written in the magnetoresistance effect element by passing the writing current through the barrier layer to determine a tunnel resistance.

11. A method of operating an a magnetoresistance effect element according to claim 1, comprising:
changing resistance of the magnetoresistance effect element by changing a direction of a writing current flowing through the magnetoresistance effect element.

12. A method of operating an a magnetoresistance effect element according to claim 1, comprising:
continuously changing a tunnel resistance of the magnetoresistance effect element by changing an amount of a writing current flowing through the magnetoresistance effect element.

13. An integrated circuit, comprising:
a plurality of the magnetoresistance effect elements according to claim 1 that are arranged in an array; and
a peripheral circuit that electrically connects at least one of the plurality of magnetoresistance effect elements.

14. An integrated circuit, comprising:
a logic circuit; and
a plurality of the magnetoresistance effect elements according to claim 1 that are arranged in a distributed manner on the logic circuit.

15. An integrated circuit, comprising
a digital memory or an analog memory that includes the magnetoresistance effect element according to claim 1.

16. An integrated circuit, comprising
a multivalued memory that includes the magnetoresistance effect element according to claim 1.

17. An artificial synapse element, comprising
the magnetoresistance effect element according to claim 1, the magnetoresistance effect element having a characteristic of spike-timing-dependent plasticity.

18. A logic-in-memory, comprising
an analog memory array including a plurality of the magnetoresistance effect elements according to claim 1;
an analog memory comprising the magnetoresistance effect element according to claim 1; and
a logic circuit, the analog memory array and the analog memory being disposed in the logic circuit.

19. A memory, comprising
a substrate;
a stacked layer including a plurality of layers, disposed on the substrate; and
a plurality of the magnetoresistance effect elements according to claim 1, each of which is disposed between any adjacent two layers in the stacked layer.

20. A magnetoresistance effect element, comprising:
a bias layer made of an antiferromagnetic material containing at least one element selected from a first group consisting of Cr, Mn, Fe, Co, and Ni, and at least one element selected from a second group consisting of Ru, Rh, Pd, Ag, Os, Ir, Pt, and Au;
a recording layer comprised of a ferromagnetic material and being disposed on the bias layer, a direction of magnetization of the recording layer being perpendicular to a surface of the recording layer and being reversible;
a barrier layer comprised of an insulator and being disposed on the recording layer; and
a reference layer comprised of a ferromagnetic material and being disposed on the barrier layer, a direction of magnetization of the reference layer being perpendicular to the surface of the recording layer and being substantially fixed.

21. The magnetoresistance effect element according to claim 20, wherein the bias layer comprised of $Pt_xMn_{(100-x)}$, or $Ir_yMn_{(100-y)}$, x being in a range of 30 to 70, y being in a range of 20 to 80.

22. A method of manufacturing a magnetoresistance effect element, comprising:
preparing a laminate structure including: a bias layer comprised of an antiferromagnetic material and having a shape in which a first length in a first direction greater than a second length in a second direction perpendicular to the first direction; a recording layer comprised of a ferromagnetic material and being disposed on the bias layer, a direction of magnetization of the recording layer being perpendicular to a surface of the recording layer and being reversible; a barrier layer comprised of an insulator and being disposed on the recording layer; and a reference layer comprised of a ferromagnetic material and being disposed on the barrier layer, a direction of magnetization of the reference layer being perpendicular to the surface of the recording layer and being substantially fixed;
heat treating the laminate structure in a magnetic field; and
patterning one of the layers in the laminate structure by lithography.

23. The manufacturing method according to claim 22, the heat treating includes applying the magnetic field in a direction in a range of +45 degrees to −45 degrees in relation to the first direction of the bias layer.

* * * * *